US011862565B2

(12) United States Patent
Sun et al.

(10) Patent No.: US 11,862,565 B2
(45) Date of Patent: Jan. 2, 2024

(54) CONTACT STRUCTURES FOR THREE-DIMENSIONAL MEMORY

(71) Applicant: Yangtze Memory Technologies Co., Ltd., Hubei (CN)

(72) Inventors: Zhongwang Sun, Hubei (CN); Zhong Zhang, Hubei (CN); Wenxi Zhou, Hubei (CN); Lei Liu, Hubei (CN); Zhiliang Xia, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 0 days.

(21) Appl. No.: 16/875,180

(22) Filed: May 15, 2020

(65) Prior Publication Data

US 2021/0287991 A1  Sep. 16, 2021

Related U.S. Application Data

(63) Continuation of application No. PCT/CN2020/079087, filed on Mar. 13, 2020.

(51) Int. Cl.
*H01L 23/535* (2006.01)
*H01L 21/321* (2006.01)
(Continued)

(52) U.S. Cl.
CPC ........ *H01L 23/535* (2013.01); *H01L 21/3212* (2013.01); *H01L 21/7684* (2013.01);
(Continued)

(58) Field of Classification Search
CPC ........ H01L 27/11582; H01L 27/11556; H01L 27/1157; H01L 27/11565; H01L 27/11573;
(Continued)

(56) References Cited

U.S. PATENT DOCUMENTS 8,633,099 B1   1/2014  Shih et al.
8,791,523 B2   7/2014  Iino et al.
(Continued)

FOREIGN PATENT DOCUMENTS

CN    103904084 A    7/2014
CN    106920794 A    7/2017
(Continued)

OTHER PUBLICATIONS

International Search Report and Written Opinion of the International Searching Authority directed to related International Patent Application No. PCT/CN2020/079087, dated Dec. 10, 2020; 7 pages.
(Continued)

*Primary Examiner* — Tony Tran
(74) *Attorney, Agent, or Firm* — Sterne, Kessler, Goldstein & Fox P.L.L.C.

(57) ABSTRACT

Embodiments of 3D memory structures and methods for forming the same are disclosed. The fabrication method includes disposing an alternating dielectric stack on a substrate, wherein the alternating dielectric stack having first and second dielectric layers alternatingly stacked on top of each other. Next, a plurality of contact openings can be formed in the alternating dielectric stack such that a dielectric layer pair can be exposed inside at least one of the plurality of contact openings. The method further includes forming a film stack of alternating conductive and dielectric layers by replacing the second dielectric layer with a conductive layer, and forming a contact structure to contact the conductive layer in the film stack of alternating conductive and dielectric layers.

5 Claims, 32 Drawing Sheets

(51) Int. Cl.
*H01L 21/768* (2006.01)
*H10B 41/27* (2023.01)
*H10B 41/35* (2023.01)
*H10B 43/27* (2023.01)
*H10B 43/35* (2023.01)

(52) U.S. Cl.
CPC .. *H01L 21/76805* (2013.01); *H01L 21/76843* (2013.01); *H01L 21/76895* (2013.01); *H10B 41/27* (2023.02); *H10B 41/35* (2023.02); *H10B 43/27* (2023.02); *H10B 43/35* (2023.02)

(58) Field of Classification Search
CPC ........ H10B 43/27; H10B 43/10; H10B 41/27; H10B 43/35; H10B 43/40
See application file for complete search history.

(56) References Cited

U.S. PATENT DOCUMENTS

| | | | |
|---|---|---|---|
| 9,716,137 | B1 | 7/2017 | Hu et al. |
| 9,754,963 | B1* | 9/2017 | Kawamura ............ H10B 43/10 |
| 9,875,929 | B1 | 1/2018 | Shukla et al. |
| 10,290,581 | B2 | 5/2019 | Tessariol et al. |
| 10,403,500 | B2 | 9/2019 | Lee |
| 10,559,592 | B1 | 2/2020 | Liu et al. |
| 10,586,804 | B2 | 3/2020 | Tomimatsu |
| 10,608,013 | B1 | 3/2020 | Xiao |
| 10,998,334 | B2* | 5/2021 | Lee ................... H01L 27/11565 |
| 11,114,463 | B2 | 9/2021 | Shin et al. |
| 11,271,007 | B2 | 3/2022 | Xia et al. |
| 11,508,743 | B2 | 11/2022 | Zhu et al. |
| 2009/0020744 | A1 | 1/2009 | Mizukami et al. |
| 2013/0234332 | A1 | 9/2013 | Iino et al. |
| 2013/0341797 | A1 | 12/2013 | Lim |
| 2016/0093524 | A1* | 3/2016 | Izumi ................ H01L 21/76816 438/637 |
| 2018/0374866 | A1 | 12/2018 | Makala et al. |
| 2018/0374868 | A1 | 12/2018 | Choi |
| 2019/0080764 | A1 | 3/2019 | Sugisaki et al. |
| 2019/0214395 | A1 | 7/2019 | Zhang et al. |
| 2020/0006364 | A1 | 1/2020 | Rabkin et al. |
| 2020/0194447 | A1 | 6/2020 | Sun et al. |
| 2021/0057441 | A1* | 2/2021 | Xu ................... H01L 21/76877 |
| 2022/0139837 | A1 | 5/2022 | Sun et al. |

FOREIGN PATENT DOCUMENTS

| | | |
|---|---|---|
| CN | 108695335 A | 10/2018 |
| CN | 108701649 A | 10/2018 |
| CN | 109417078 A | 3/2019 |
| CN | 109524417 A | 3/2019 |
| CN | 109716521 A | 5/2019 |
| CN | 110741475 A | 1/2020 |
| CN | 110800109 A | 2/2020 |
| CN | 111448648 B | 6/2021 |
| JP | 2012-244180 A | 12/2012 |
| JP | 2013-055136 A | 3/2013 |
| JP | 2013-187335 A | 9/2013 |
| JP | 2014-022717 A | 2/2014 |
| JP | 2019-057623 A | 4/2019 |
| KR | 10-2019-0009070 A | 1/2019 |

OTHER PUBLICATIONS

Office Action directed to Korean Patent Application No. 10-2021-7033137, dated Jul. 20, 2023; 18 pages.

* cited by examiner

2200

Disposing an alternating dielectric stack on a substrate, the alternating dielectric stack having first and second dielectric layers — S2210

Forming channel holes and memory strings in the alternating dielectric stack — S2220

Forming a plurality of contact openings in the alternating dielectric stack by using multiple contact masks — S2230

Disposing a liner on a sidewall of each contact hole — S2240

Forming a slit opening in the alternating dielectric stack — S2250

Forming a film stack of alternating conductive and dielectric layers — S2260

Forming a contact structure electrically connected with the conductive layer in the film stack of alternating conductive and dielectric layers — S2270

Fig. 22

CONTACT STRUCTURES FOR THREE-DIMENSIONAL MEMORY

CROSS-REFERENCE TO RELATED APPLICATIONS AND INCORPORATION BY REFERENCE

This application claims priority to PCT/CN2020/079087 filed on Mar. 13, 2020, which is incorporated herein by reference in its entirety.

TECHNICAL FIELD

The present disclosure generally relates to the field of semiconductor technology, and more particularly, to a method for forming a three-dimensional (3D) memory.

BACKGROUND

As memory devices are shrinking to smaller die size to reduce manufacturing cost and increase storage density, scaling of planar memory cells faces challenges due to process technology limitations and reliability issues. A three-dimensional (3D) memory architecture can address the density and performance limitation in planar memory cells.

In a 3D NAND memory, a staircase structure is typically used to provide electrical contacts between word lines and control gates of the vertically stacked memory cells. However, as storage capacity continues to increase in a 3D NAND memory, the number of vertically stacked memory cells has been increased greatly. Accordingly, the lateral dimensions of the staircase structure are also increased, which reduces the effective storage capacity per area. Furthermore, larger staircase structure introduces higher mechanical stress between the memory array region and the staircase region, which may cause reliability problems in the 3D NAND memory. Therefore, a need exists for contact structures of a 3D memory that can provide electrical connections between word lines and control gates of the vertically stacked memory cells without using a staircase structure.

BRIEF SUMMARY

Embodiments of a three-dimensional (3D) memory device and methods for forming the same are described in the present disclosure.

The first aspect of the present disclosure provides a method for forming a three-dimensional (3D) memory structure that includes disposing an alternating dielectric stack on a substrate, wherein the alternating dielectric stack includes first and second dielectric layers alternatingly stacked on top of each other. The method also includes forming a plurality of contact openings in the alternating dielectric stack such that a dielectric layer pair is exposed inside at least one of the plurality of contact openings, wherein the dielectric layer pair includes one pair of the first and second dielectric layers. The method further includes forming a film stack of alternating conductive and dielectric layers by replacing the second dielectric layer with a conductive layer, and forming a contact structure to contact the conductive layer in the film stack of alternating conductive and dielectric layers.

The formation of the plurality of contact openings includes forming a plurality of openings in the alternating dielectric stack by etching N number of dielectric layer pairs (N is a whole number). Next, a mask is formed to protect a first group of the plurality of openings and expose a second group of the plurality of openings, wherein the first group of the plurality of openings is a first subset of openings extending through the N number of dielectric layer pairs. The formation of the plurality of contact openings further includes forming a second subset of openings in the second group of the plurality of openings by etching M number of dielectric layer pairs (M is a whole number). The second subset of openings extend through (N+M) number of dielectric layer pairs. By repeating the steps of forming a mask and etching for each of the subsets of openings, the plurality of contact openings can be formed in the alternating dielectric stack.

In some embodiments, the first and second subsets of openings include the same number of openings.

In some embodiments, the M number of dielectric layer pairs is twice as many as the N number of dielectric layer pairs.

In some embodiments, the forming of the film stack of alternating conductive and dielectric layers includes forming a slit opening in the alternating dielectric stack. In some embodiments, the forming of the film stack also includes forming, in the slit opening, a common source contact electrically connected with the substrate.

In some embodiments, the method for forming a 3D memory structure further includes disposing a filling material inside the plurality of contact openings.

In some embodiments, the method for forming a 3D memory structure also includes forming a plurality of memory strings in the alternating dielectric stack prior to the forming of the plurality of contact openings.

In some embodiments, the method for forming a 3D memory structure further includes forming a plurality of memory strings in the alternating dielectric stack after the forming of the plurality of contact openings.

In some embodiments, forming of the plurality of memory strings includes forming a channel hole vertically penetrating the alternating dielectric stack, and disposing a memory film, a channel layer, and a core filling film on a sidewall of a channel hole.

In some embodiments, forming the contact structure includes forming a liner on a sidewall of the plurality of contact openings, forming a contact hole inside each of the plurality of contact openings to expose the conductive layer in the film stack of alternating conductive and dielectric layers, and disposing a conductive material inside the contact hole to form electrical contact with the conductive layer. In some embodiments, forming the contact structures also includes forming a coplanar surface by chemical mechanical polishing.

The second aspect of the present disclosure provides a three-dimensional (3D) memory structure that includes a film stack disposed on a substrate, the film stack having conductive and dielectric layers alternatingly stacked on top of each other. The 3D memory structure also includes a plurality of memory strings vertically penetrating through the film stack, wherein each of the plurality of memory strings comprises a memory film, a channel layer and a core filling film. The 3D memory structure also includes a plurality of contact structures disposed inside the film stack, the plurality of contact structures vertically penetrating one or more conductive and dielectric layers such that each conductive layer of the film stack is electrically connected to at least one of the plurality of contact structures. The plurality of contact structures are surrounded by the plurality of memory strings.

In some embodiments, each of the plurality of contact structures comprises a liner surrounding a conductive material. In some embodiments, the liner includes an insulator, configured to electrically isolate the plurality of contact structures from one or more conductive layers of the film stack.

In some embodiments, the 3D memory structure also includes a common source contact vertically penetrating the film stack, wherein the common source contact is electrically connected with the substrate. In some embodiments, the common source contact includes an isolation liner configured to electrically isolate the common source contact from the conductive layers of the film stack.

In some embodiments, the 3D memory structure further includes a plurality of dummy memory strings vertically penetrating through the film stack adjacent to the plurality of contact structures, wherein each of the plurality of dummy memory strings includes a core filling film.

In some embodiments, the plurality of contact structures are coplanar with the film stack.

In some embodiments, the plurality of contact structures are randomly distributed in a memory array.

The third aspect of the present disclosure provides another method for forming a three-dimensional (3D) memory structure that includes disposing an alternating dielectric stack on a substrate, wherein the alternating dielectric stack includes $2^n$ number of dielectric layer pairs, wherein n is an integer and each dielectric layer pair includes a first dielectric layer and a second dielectric layer that is different from the first dielectric layer. The method also includes forming a plurality of contact openings by using (n+1) cycles of repetitive patterning process. An i-th patterning process includes etching $2^{(i-1)}$ number of dielectric layer pairs such that top $2^i$ number of dielectric layer pairs are exposed inside the plurality of contact openings, where i is an integer ranging from 1 to n. The method of forming the 3D memory structure further includes forming a film stack of alternating conductive and dielectric layers by replacing the second dielectric layer with a conductive layer, and forming a contact structure electrically connected to the conductive layer in the film stack of alternating conductive and dielectric layers.

In some embodiments, the i-th patterning process further includes, prior to the etching, forming a mask to expose a subset of the plurality of contact openings wherein top $2^{(i-1)}$ number of dielectric layer pairs are exposed inside the subset of the plurality of contact openings.

In some embodiments, the method for forming a 3D memory structure further includes, prior to forming of the plurality of contact openings, disposing a hard mask on the alternating dielectric stack, and forming a plurality of openings in the hard mask.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIG. 22 illustrates a flow diagram of another exemplary method for forming a 3D memory device in accordance with some embodiments of the present disclosure.

Figure 1:
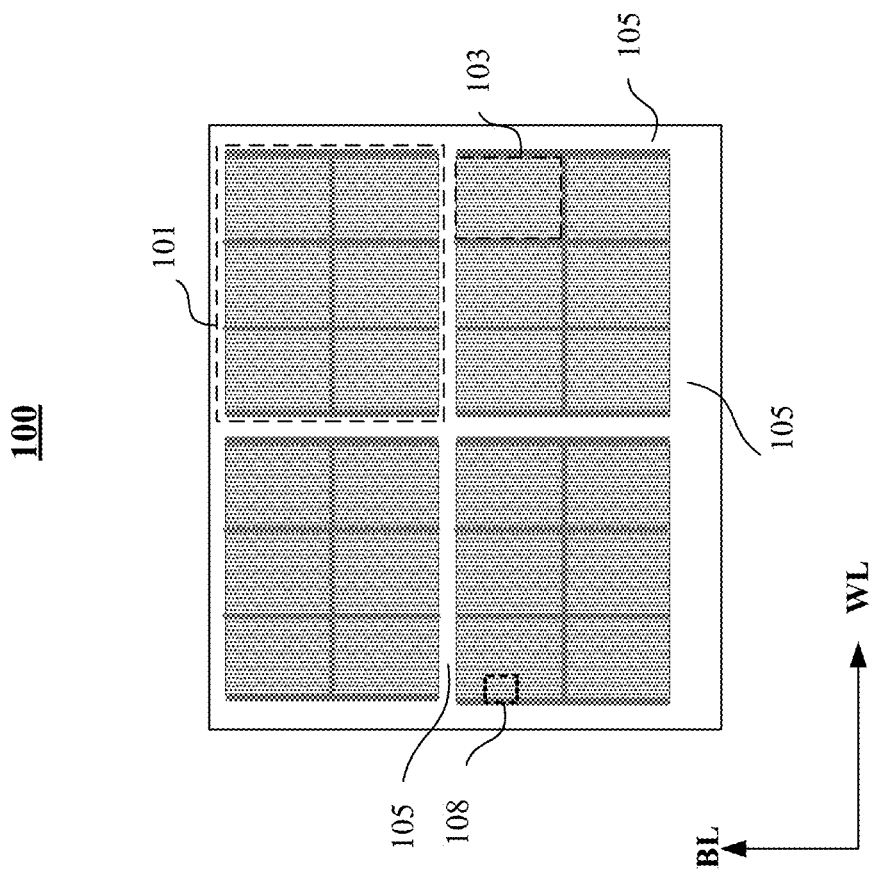
FIG. 1 illustrates a schematic top-down view of an exemplary three-dimensional (3D) memory die, according to some embodiments of the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more"

as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer therebetween. Moreover, "above" or "over" not only means "above" or "over" something, but can also include the meaning it is "above" or "over" something with no intermediate feature or layer therebetween (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductive and contact layers (in which contacts, interconnect lines, and/or vertical interconnect accesses (VIAs) are formed) and one or more dielectric layers.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

FIG. 1 illustrates a top-down view of an exemplary three-dimensional (3D) memory device 100, according to some embodiments of the present disclosure. The 3D memory device 100 can be a memory chip (package), a memory die or any portion of a memory die, and can include one or more memory planes 101, each of which can include a plurality of memory blocks 103. Identical and concurrent operations can take place at each memory plane 101. The memory block 103, which can be megabytes (MB) in size, is the smallest size to carry out erase operations. Shown in FIG. 1, the exemplary 3D memory device 100 includes four memory planes 101 and each memory plane 101 includes six memory blocks 103. Each memory block 103 can include a plurality of memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" in FIG. 1. In this disclosure, memory block 103 is also referred to as a "memory array" or "array." The memory array is the core area in a memory device, performing storage functions.

The 3D memory device 100 also includes a periphery region 105, an area surrounding memory planes 101. The periphery region 105 contains many digital, analog, and/or mixed-signal circuits to support functions of the memory array, for example, page buffers, row and column decoders and sense amplifiers. Peripheral circuits use active and/or passive semiconductor devices, such as transistors, diodes, capacitors, resistors, etc., as would be apparent to a person of ordinary skill in the art.

It is noted that, the arrangement of the memory planes 101 in the 3D memory device 100 and the arrangement of the memory blocks 103 in each memory plane 101 illustrated in FIG. 1 are only used as an example, which does not limit the scope of the present disclosure.

Figure 2:
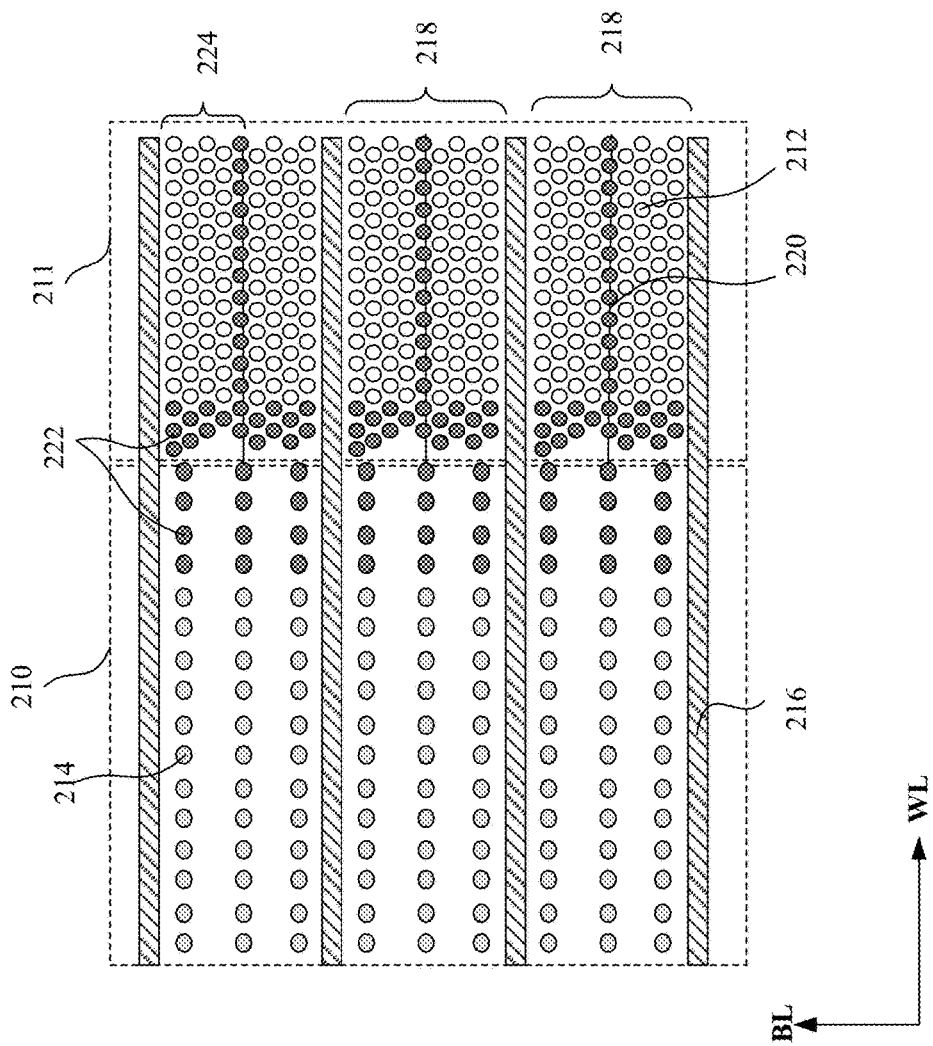
FIG. 2 illustrates a schematic top-down view of a region of 3D memory die, according to some embodiments of the present disclosure.

Referring to FIG. 2, an enlarged top-down view of a region 108 in FIG. 1 is illustrated, according to some embodiments of the present disclosure. The region 108 of the 3D memory device 100 can include a staircase region 210 and a channel structure region 211. The channel structure region 211 can include an array of memory strings 212, each including a plurality of stacked memory cells. The staircase region 210 can include a staircase structure and an array of contact structures 214 formed on the staircase structure. In some embodiments, a plurality of slit structures 216, extending in the direction of the word lines (WL) across the channel structure region 211 and the staircase region 210, can divide a memory block into multiple memory fingers 218, where the direction of the WL (i.e., the WL direction) is similar to the one shown in FIG. 1. At least some slit structures 216 can function as the common source contact for an array of memory strings 212 in channel structure regions 211. A top select gate cut 220 can be disposed, for example, in the middle of each memory finger 218 to divide a top select gate (TSG) of the memory finger 218 into two portions, and thereby can divide a memory finger into two memory slices 224, where memory cells in a memory slice 224 that share the same word line form a programmable (read/write) memory page. While erase operation of a 3D NAND memory can be carried out at memory block level, read and write operations can be carried out at memory page level. A memory page can be kilobytes (KB) in size. In some embodiments, region 108 also includes dummy memory strings 222 for process variation control during fabrication and/or for additional mechanical support.

Figure 3:
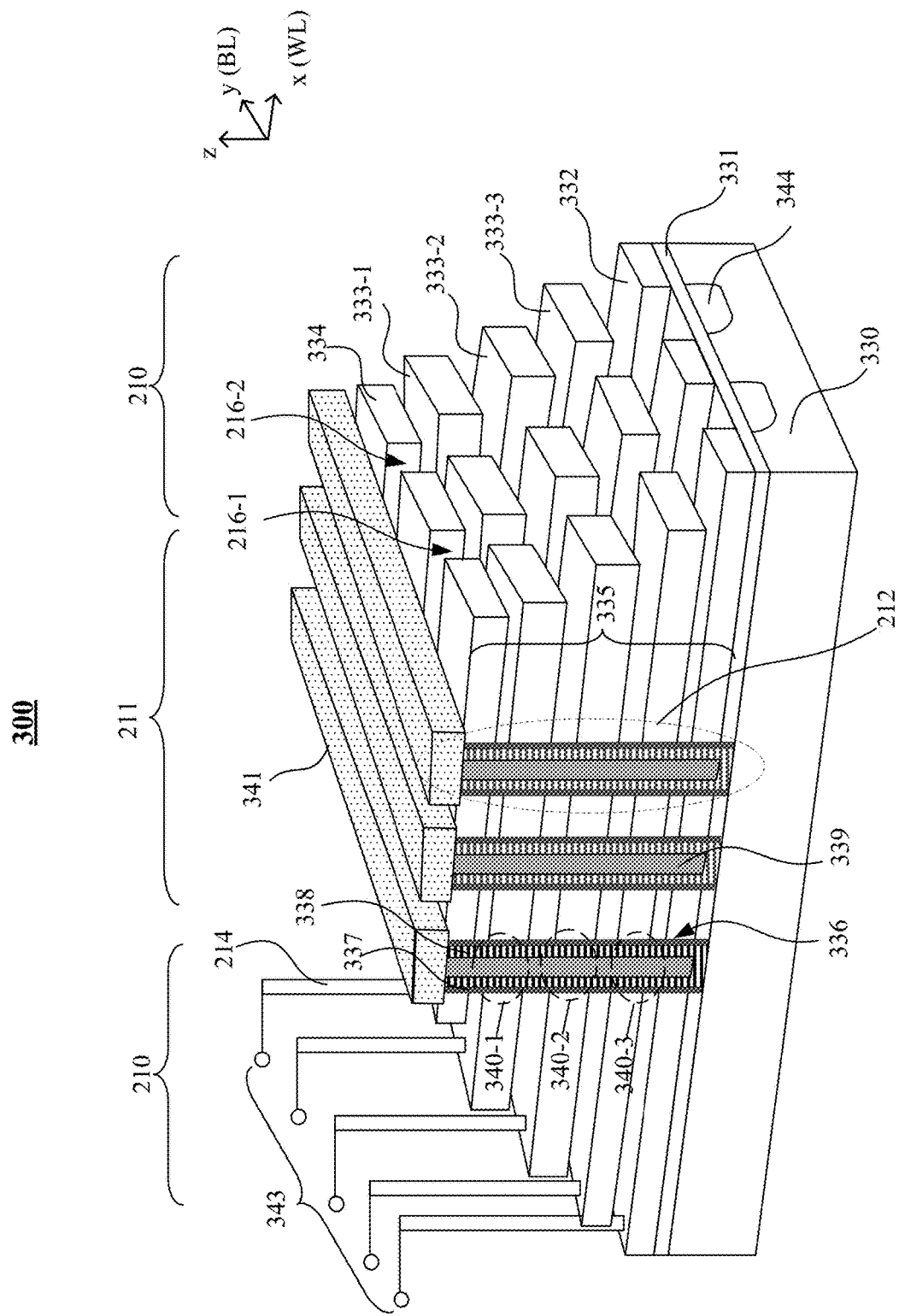
FIG. 3 illustrates a perspective view of a portion of an exemplary 3D memory array structure, in accordance with some embodiments of the present disclosure.

FIG. 3 illustrates a perspective view of a portion of an exemplary three-dimensional (3D) memory array structure 300, according to some embodiments of the present disclosure. The memory array structure 300 includes a substrate 330, an insulating film 331 over the substrate 330, a tier of lower select gates (LSGs) 332 over the insulating film 331, and a plurality of tiers of control gates 333, also referred to as "word lines (WLs)," stacking on top of the LSGs 332 to form a film stack 335 of alternating conductive and dielectric layers. The dielectric layers adjacent to the tiers of control gates are not shown in FIG. 3 for clarity.

The control gates of each tier are separated by slit structures 216-1 and 216-2 through the film stack 335. The memory array structure 300 also includes a tier of top select gates (TSGs) 334 over the stack of control gates 333. The stack of TSG 334, control gates 333 and LSG 332 is also referred to as "gate electrodes." The memory array structure 300 further includes memory strings 212 and doped source line regions 344 in portions of substrate 330 between adjacent LSGs 332. Each memory string 212 includes a channel hole 336 extending through the insulating film 331 and the film stack 335 of alternating conductive and dielectric layers. Memory strings 212 also includes a memory film 337 on a sidewall of the channel hole 336, a channel layer 338 over the memory film 337, and a core filling film 339 surrounded by the channel layer 338. A memory cell 340 can be formed at the intersection of the control gate 333 and the memory string 212. The memory array structure 300 further includes a plurality of bit lines (BLs) 341 connected with the memory strings 212 over the TSGs 334. The memory array structure 300 also includes a plurality of metal interconnect lines 343 connected with the gate electrodes through a plurality of contact structures 214. The edge of the film stack 335 is configured in a shape of staircase to allow an electrical connection to each tier of the gate electrodes.

In FIG. 3, for illustrative purposes, three tiers of control gates 333-1, 333-2, and 333-3 are shown together with one tier of TSG 334 and one tier of LSG 332. In this example, each memory string 212 can include three memory cells 340-1, 340-2 and 340-3, corresponding to the control gates 333-1, 333-2 and 333-3, respectively. In some embodiments, the number of control gates and the number of memory cells can be more than three to increase storage capacity. The memory array structure 300 can also include other structures, for example, TSG cut, common source contact and dummy memory string. These structures are not shown in FIG. 3 for simplicity.

To pursue higher storage capacity in a 3D memory, the number of vertically stacked memory cells has been increased greatly. As a result, the number of control gates or word lines 333 has been increased greatly. To form electrical contact (e.g., contact structure 214) for each word line 333, the staircase region 210 has been extended laterally from either side of the channel structure region 211. The increased dimension of staircase region 210 reduces the effective storage capacity per unit area and thus increases cost per bit of the 3D memory. Furthermore, large staircase region 210 may introduce mechanical stress in the channel structure region 211, which may cause reliability problems in the memory cells. Therefore, a need exists to form contact structures for a 3D memory without relying on a staircase structure.

Figure 4:
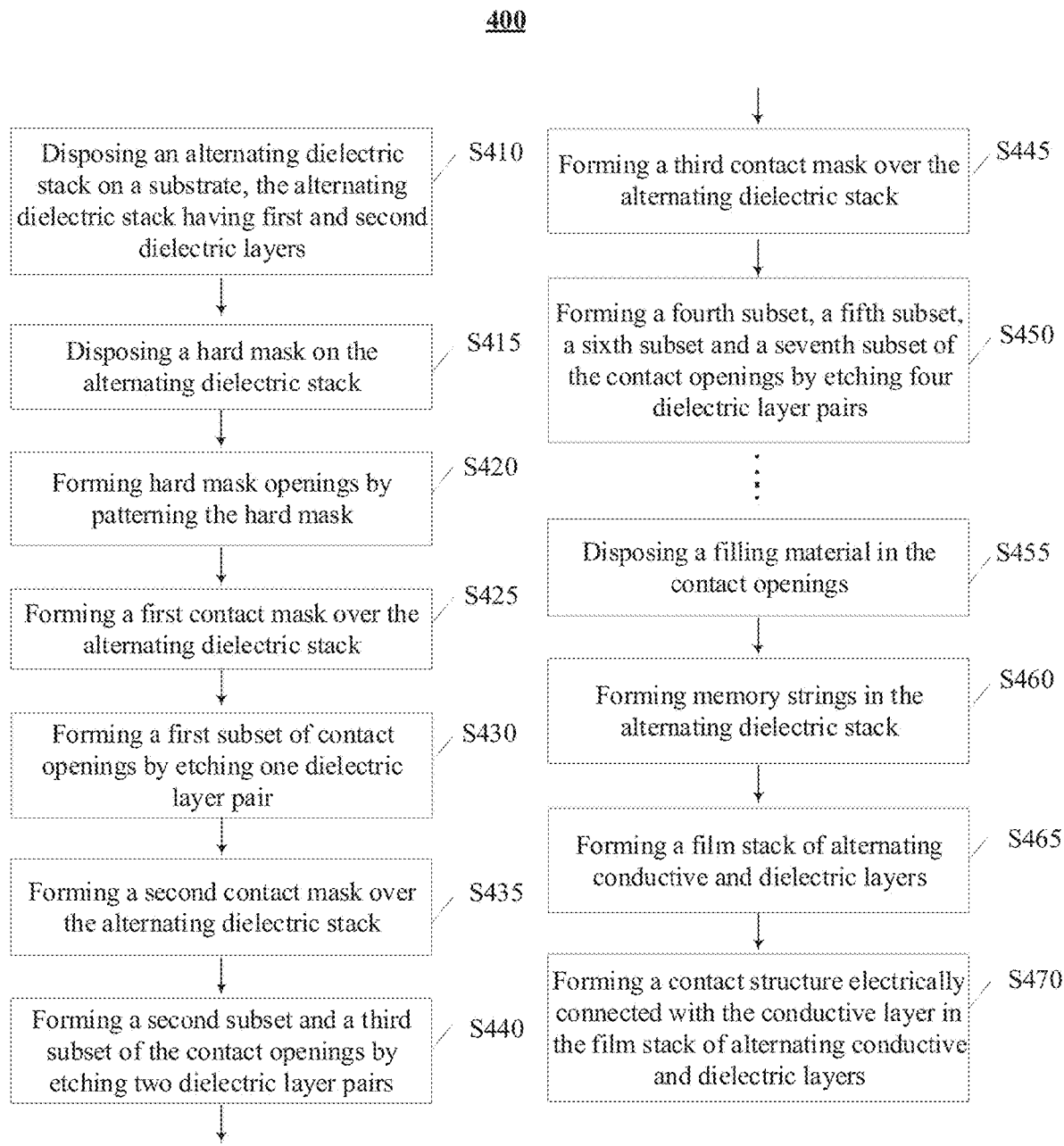
FIG. 4 illustrates a flow diagram of an exemplary method for forming a 3D memory device in accordance with some embodiments of the present disclosure.

FIG. 4 illustrates an exemplary fabrication process 400 for forming a 3D memory device, accordance to some embodiments of the present disclosure. FIGS. 5-13, 14A-14B, 15-20 illustrate cross-sectional views of the 3D memory device at various process steps according to the fabrication process 400. It should be understood that the process steps shown in fabrication process 400 are not exhaustive and that other process steps can be performed as well before, after, or between any of the illustrated process steps. In some embodiments, some process steps of exemplary fabrication process 400 can be omitted or other process steps can be included, which are not described here for simplicity. In some embodiments, process steps of fabrication process 400 can be performed in a different order and/or vary.

As shown in FIG. 4, fabrication process 400 starts at process step S410, where an alternating dielectric stack can be disposed on a substrate. An example of a 3D memory device at the process step S410 is shown as a 3D memory structure 500 in FIG. 5.

In some embodiments, the substrate of the 3D memory structure 500 can be similar to the substrate 330 in FIG. 3. The substrate 330 can provide a platform for forming subsequent structures. In some embodiments, the substrate 330 can be any suitable semiconductor substrate having any suitable semiconductor materials, such as monocrystalline, polycrystalline or single crystalline semiconductors. For example, the substrate 330 can include silicon, silicon germanium (SiGe), germanium (Ge), silicon on insulator (SOI), germanium on insulator (GOI), gallium arsenide (GaAs), gallium nitride, silicon carbide, III-V compound, or any combinations thereof. In some embodiments, the substrate 330 can include a layer of semiconductor material formed on a handle wafer, for example, glass, plastic, or another semiconductor substrate.

A front surface 330f of the substrate 330 is also referred to as a "main surface" or a "top surface" of the substrate herein. Layers of materials can be disposed on the front surface 330f of the substrate 330. A "topmost" or "upper" layer is a layer farthest or farther away from the front surface 330f of the substrate. A "bottommost" or "lower" layer is a layer closest or closer to the front surface 330f of the substrate.

In some embodiments, the alternating dielectric stack 554 includes a plurality of dielectric layer pairs 556 alternatingly stacked on top of each other, where each dielectric layer pair 556 includes a first dielectric layer 558 and a second dielectric layer 560 (also referred to as "sacrificial layer") that is different from the first dielectric layer 558. The alternating dielectric stack 554 extends in a lateral direction that is parallel to the front surface 330f of the substrate 330.

In the alternating dielectric stack 554, first dielectric layers 558 and second dielectric layers 560 alternate in a vertical direction, perpendicular to the substrate 330. In the other words, each second dielectric layer 560 can be sandwiched between two first dielectric layers 558, and each first dielectric layer 558 can be sandwiched between two second dielectric layers 560 (except the bottommost and the topmost layer).

Figure 5:
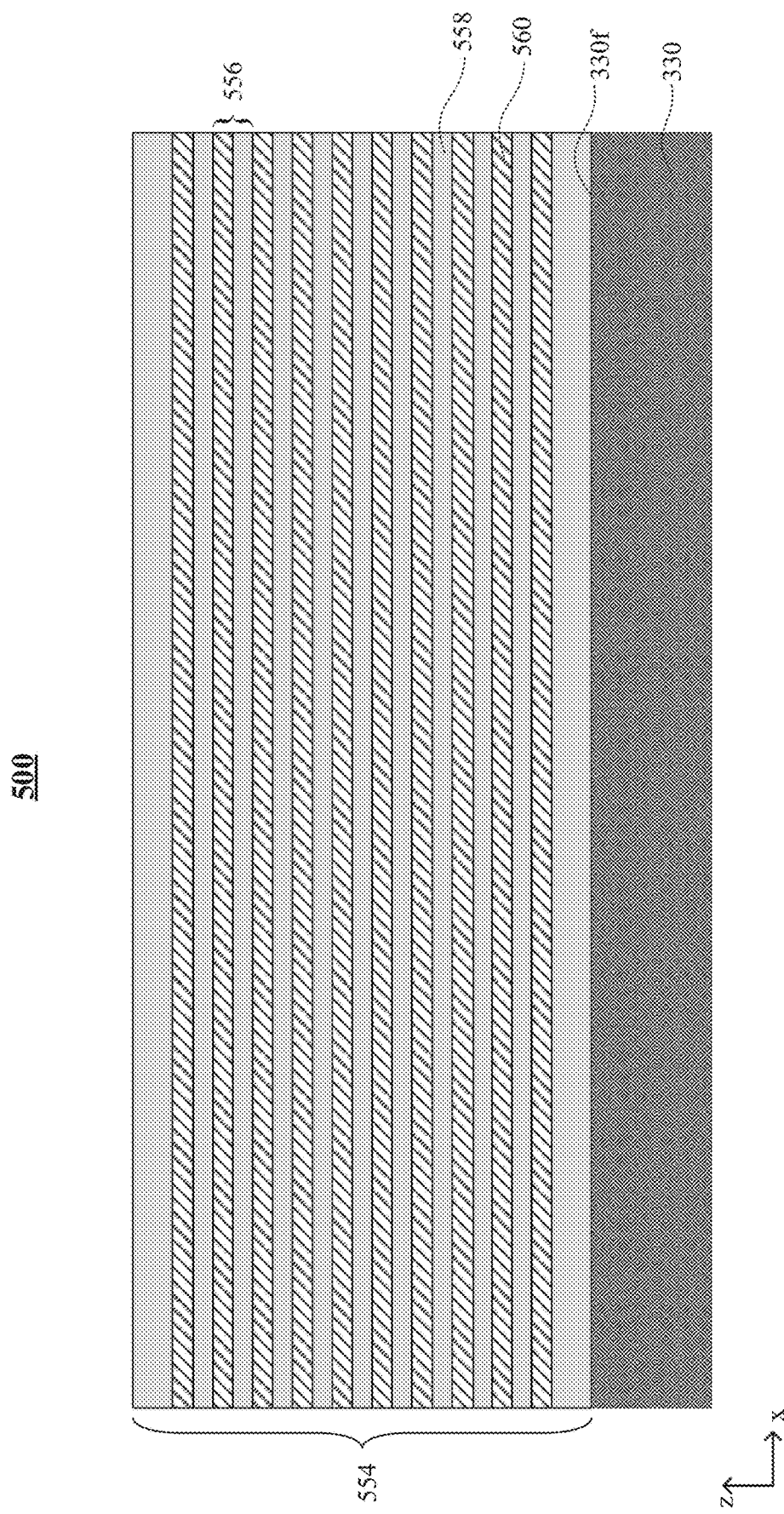
FIGS. 5-13 and 14A illustrate cross-sectional views of an exemplary 3D memory device at various process steps, following the flow diagram of FIG. 4, according to some embodiments of the present disclosure.
Figure 6:
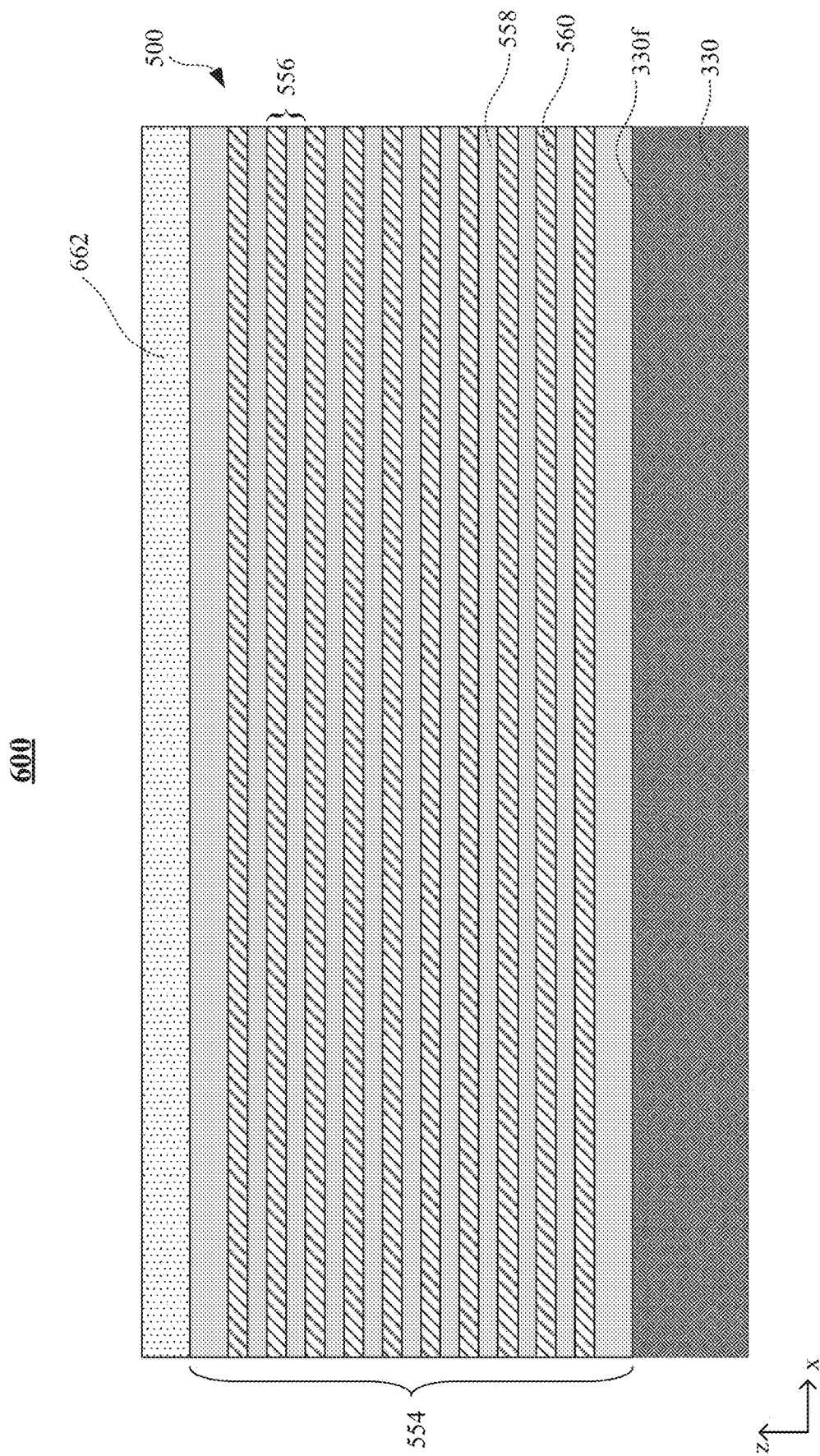

The formation of the alternating dielectric stack 554 can include disposing the first dielectric layers 558 to each have the same thickness or to have different thicknesses. Example thicknesses of the first dielectric layers 558 can range from 10 nm to 500 nm, preferably about 25 nm. Similarly, the second dielectric layer 560 can each have the same thickness or have different thicknesses. Example thicknesses of the second dielectric layer 560 can range from 10 nm to 500 nm, preferably about 35 nm. It should be understood that the number of dielectric layer pairs 556 in FIG. 5 is for illustrative purposes only and that any suitable number of layers may be included in the alternating dielectric stack 554.

In some embodiments, the first dielectric layer 558 includes any suitable insulating materials, for example, silicon oxide, silicon oxynitride, silicon nitride, TEOS or silicon oxide with F-, C-, N-, and/or H-incorporation. The first dielectric layer 558 can also include high-k dielectric materials, for example, hafnium oxide, zirconium oxide, aluminum oxide, tantalum oxide, or lanthanum oxide films. In some embodiments, the first dielectric layer 558 can be any combination of the above materials.

The formation of the first dielectric layer 558 on the substrate 330 can include any suitable deposition methods such as, chemical vapor deposition (CVD), physical vapor deposition (PVD), plasma-enhanced CVD (PECVD), rapid thermal chemical vapor deposition (RTCVD), low pressure chemical vapor deposition (LPCVD), sputtering, metal-organic chemical vapor deposition (MOCVD), atomic layer deposition (ALD), high-density-plasma CVD (HDP-CVD), thermal oxidation, nitridation, any other suitable deposition method, and/or combinations thereof.

In some embodiments, the second dielectric layer 560 includes any suitable material that is different from the first dielectric layer 558 and can be removed selectively with respect to the first dielectric layer 558. For example, the second dielectric layer 560 can include silicon oxide, silicon oxynitride, silicon nitride, TEOS, poly-crystalline silicon, poly-crystalline germanium, poly-crystalline germanium-silicon, and any combinations thereof. In some embodiments, the second dielectric layer 560 also includes amorphous semiconductor materials, such as amorphous silicon or amorphous germanium. The second dielectric layer 560 can be disposed using a similar technique as the first dielectric layer 558, such as CVD, PVD, ALD, thermal oxidation or nitridation, or any combination thereof.

In some embodiments, the first dielectric layer 558 can be silicon oxide and the second dielectric layer 560 can be silicon nitride.

In some embodiments, the alternating dielectric stack 554 can include layers in addition to the first dielectric layer 558 and the second dielectric layer 560, and can be made of different materials and/or with different thicknesses.

In addition to the alternating dielectric stack 554, in some embodiments, peripheral devices (not shown) can be formed in the periphery region 105 (see FIG. 1) on the front surface 330f of the substrate 330. In some embodiments, active device areas (not shown) can also be formed in the memory blocks 103 (see FIG. 1) on the front surface 330f of the substrate 330. In some embodiments, the substrate 330 can further include an insulating film 331 on the front surface 330f (not shown in FIG. 5). The insulating film 331 can be made of the same or different material from the alternating dielectric stack 554.

The peripheral devices can include any suitable semiconductor devices, for example, metal oxide semiconductor field effect transistors (MOSFETs), diodes, resistors, capacitors, etc. The peripheral devices can be used in the design of digital, analog and/or mixed signal circuits supporting the storage function of the memory core, for example, row and column decoders, drivers, page buffers, sense amplifiers, timing and controls.

The active device areas in the memory blocks are surrounded by isolation structures, such as shallow trench isolation. Doped regions, such as p-type doped and/or n-type doped wells, can be formed in the active device area according to the functionality of the array devices in the memory blocks.

Referring to FIG. 4, at process step S415, a hard mask can be disposed on the alternating dielectric stack, according to some embodiments of the present disclosure. An example of a 3D memory device at process step S415 is illustrated as a 3D memory structure 600 in FIG. 6. The 3D memory structure 600 includes a hard mask 662 disposed on the alternating dielectric stack 554. The hard mask 662 is used to provide protection to the underlying structures and materials during subsequent etching process. In some embodiments, the hard mask 662 includes any suitable material that can withstand the etching process, for example, silicon oxide, silicon oxynitride, silicon nitride, TEOS, amorphous silicon, polycrystalline silicon, high-k dielectric materials, or any combination thereof. In some embodiments, the hard mask 662 can include amorphous carbon. In some embodiments, amorphous carbon can be doped with other etch-resistant elements, such as boron, to improve the etch-resistance of the amorphous carbon. In some embodiments, a thin metal or metal oxide layer, such as zirconium oxide ($ZrO_2$), yttrium oxide ($Y_2O_3$), and aluminum oxide ($Al_2O_3$), can be disposed on top of the amorphous carbon layer. The hard mask 662 can be disposed by LPCVD, RTCVD, PECVD, ALD, PVD, evaporation, sputtering, or any combination thereof.

Figure 7:
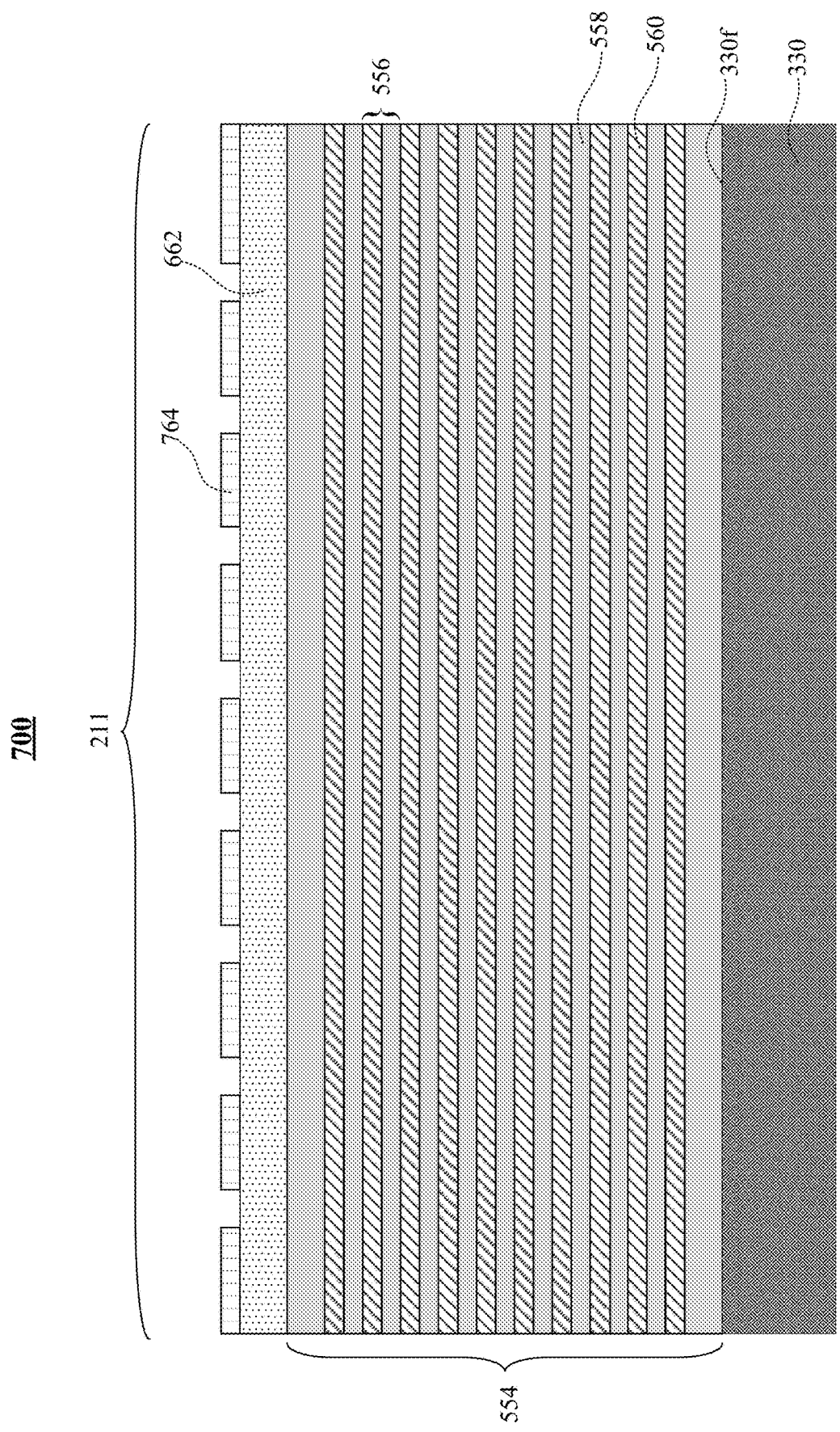
Figure 8:
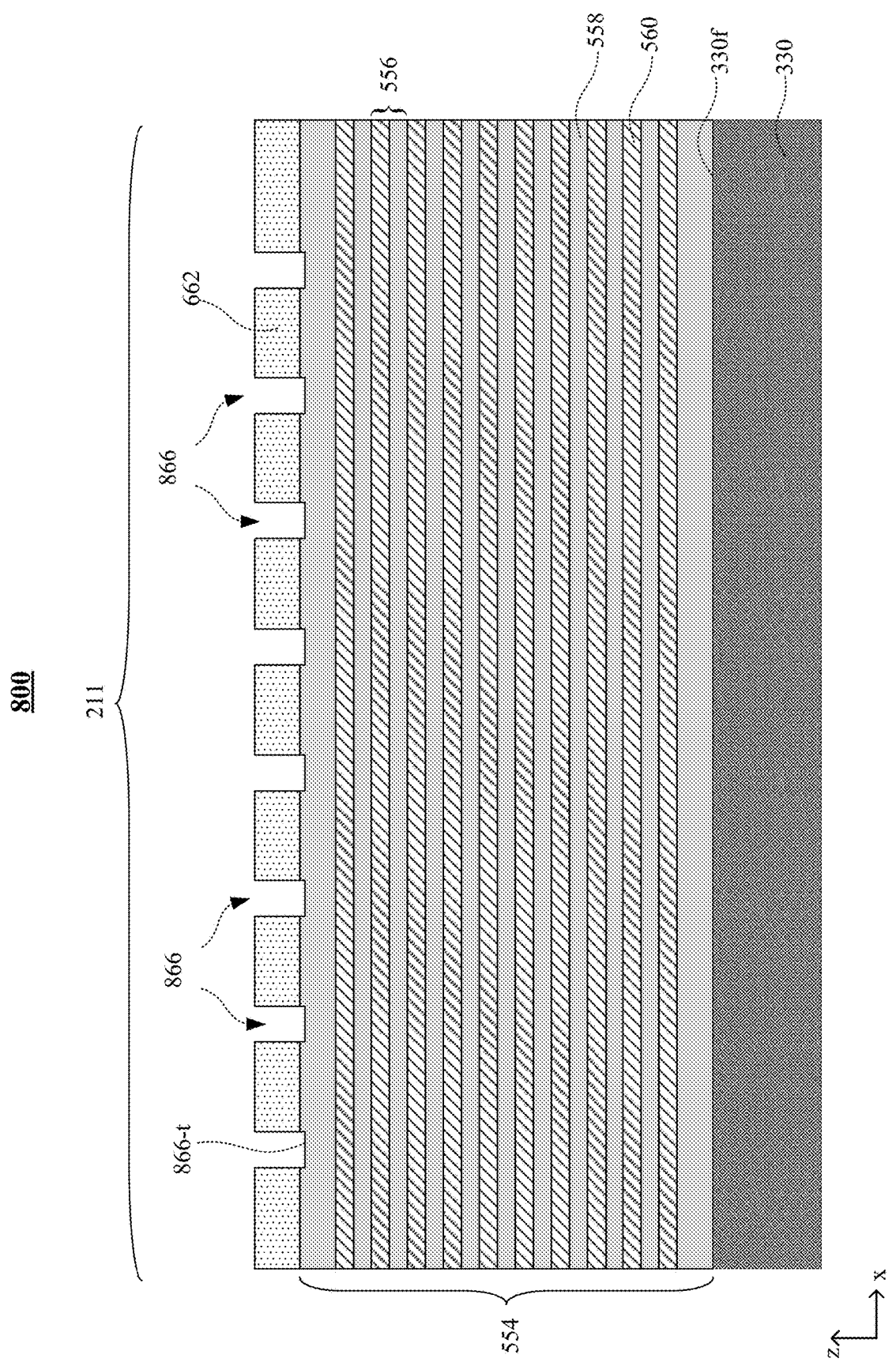

FIG. 7 illustrates a 3D memory structure 700, according to some embodiments of the present disclosure. The 3D memory structure 700 includes a contact defining mask 764 disposed on the hard mask 662 over the alternating dielectric stack 554. In some embodiments, the contact defining mask 764 can include a photoresist or carbon-based polymer material, and can be formed using a patterning process such as lithography. The contact defining mask 764 defines the location of contact structures for control gates and select gates of a 3D memory device that will be formed in the subsequent processes. In some embodiments, the contact structures can be similar to the contact structures 214 for the control gate 333, top select gate (TSG) 334 and lower select gate (LSG) 332 shown in FIG. 3. The contact structures 214 can be placed in a region (e.g., the staircase region 210) adjacent to the channel structure region 211 in FIG. 3. In some embodiments, the contact structures 214 can also be placed inside the channel structure region 211, which will be discussed in detail below.

Referring to FIG. 4, at process step S420, a plurality of hard mask openings can be formed by patterning the hard mask, according to some embodiments of the present disclosure. An exemplary 3D memory device at process step S420 is illustrated as a 3D memory structure 800 in FIG. 8. The 3D memory structure 800 includes a plurality of hard mask openings 866, formed by patterning the hard mask 662 using the contact defining mask 764 in FIG. 7. The hard mask openings expose a top surface 866-$t$ of the first dielectric layer pair (i.e., the topmost dielectric layer pair in the alternating dielectric stack 554).

In some embodiments, the hard mask openings 866 can be patterned by using a suitable etching process such as wet etching, dry etching, and/or a combination thereof. In some embodiments, the hard mask 662 can be etched using an anisotropic etching such as a reactive ion etching (ME) or other dry etching processes. In some embodiments, the hard mask 662 is silicon oxide. In this example, the etching of silicon oxide can include ME using fluorine-based gases such as carbon-fluorine ($CF_4$), hexafluoroethane ($C_2F_6$), $CHF_3$, or $C_3F_6$ and/or any other suitable gases. In some embodiments, the silicon oxide layer can be etched by wet chemistry, such as hydrofluoric acid or a mixture of hydrofluoric acid and ethylene glycol. In some embodiments, a timed-etch approach can be used. In some embodiments, the hard mask 662 is silicon nitride. In this example, the etching of silicon nitride can include ME using $O_2$, $N_2$, $CF_4$, $NF_3$, $Cl_2$, HBr, $BCl_3$, and/or combinations thereof. The methods and etchants to pattern the hard mask 662 should not be limited by the embodiments of the present disclosure.

In some embodiments, after forming the hard mask openings 866, the contact defining mask 764 in FIG. 7 can be removed by using techniques such as dry etching with $O_2$ or $CF_4$ plasma, or wet etching with resist/polymer stripper, for example solvent based chemicals.

Referring to FIG. 4, at process step S425, a first contact mask can be formed over the alternating dielectric stack, according to some embodiments of the present disclosure. An exemplary 3D memory device at process step S425 is illustrated as a 3D memory structure 900 in FIG. 9.

In some embodiments, the 3D memory structure 900 includes a first contact mask 968 disposed on the 3D memory structure 800, over at least a portion of the alternating dielectric stack. In some embodiments, the first contact mask 968 covers half of the hard mask openings 866 and exposes the other half of the hard mask openings 866. In some embodiments, the first contact mask 968 can include a photoresist or carbon-based polymer material, and can be formed using a patterning process such as lithography.

Referring to FIG. 4, at process step S430, a first subset of contact openings can be formed in the alternating dielectric stack, according to some embodiments of the present disclosure. An exemplary 3D memory device at process step S430 is illustrated as a 3D memory structure 1000 in FIG. 10. The 3D memory structure 1000 includes a first subset of contact openings 1070.

Figure 9:
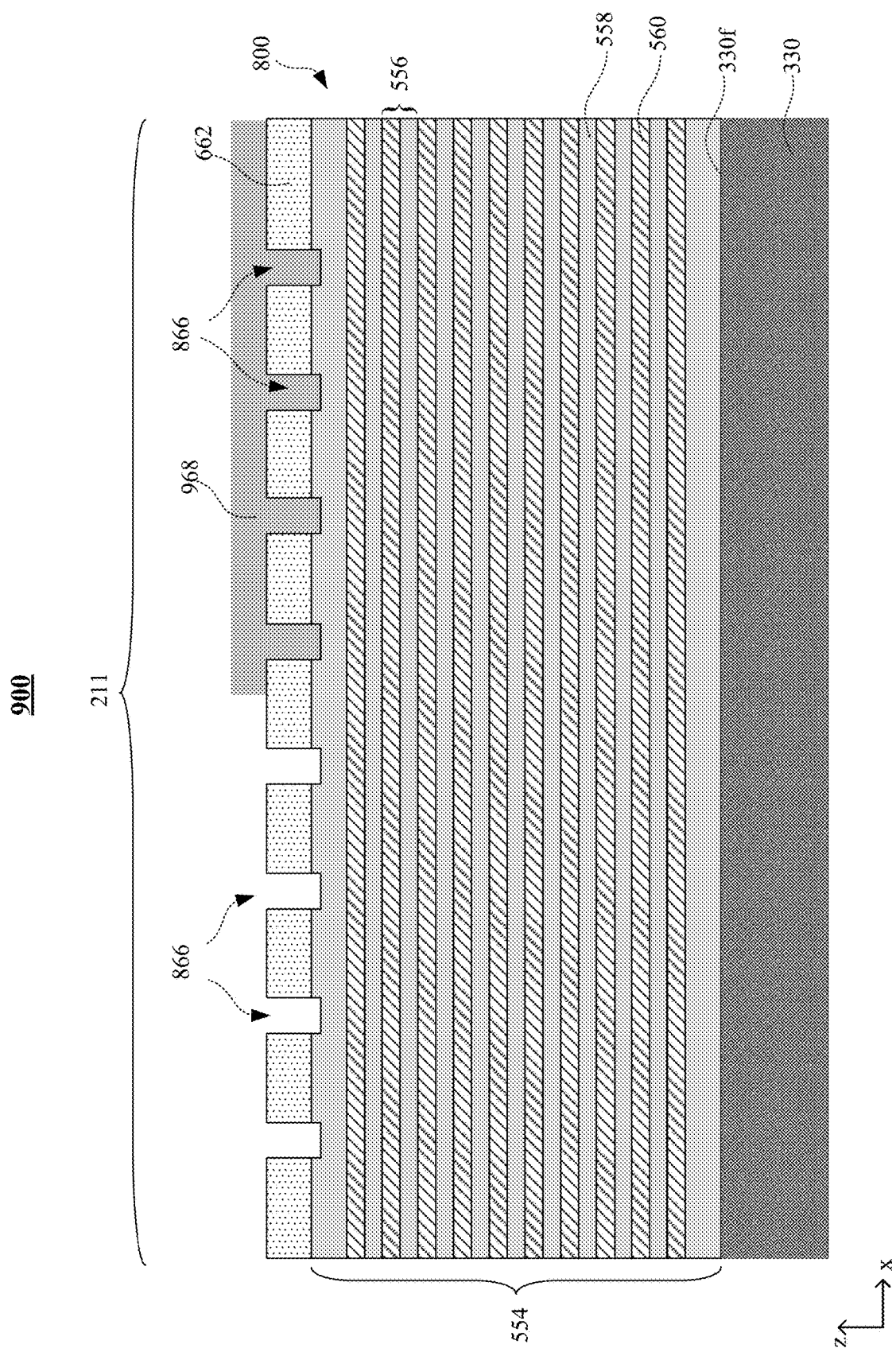
Figure 10:
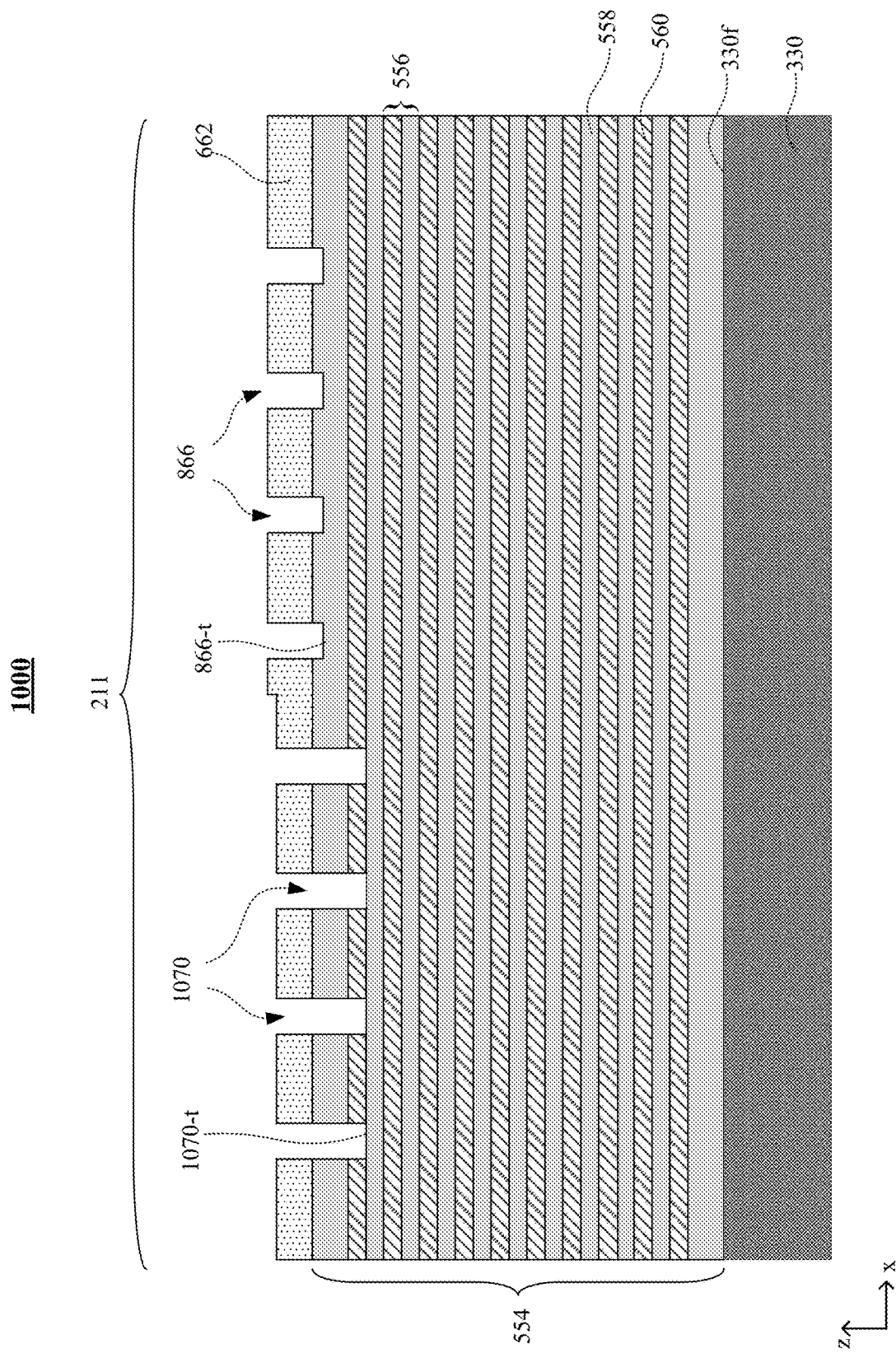

In some embodiments, the first subset of contact openings 1070 can be formed by etching one dielectric layer pair 556 using the first contact mask 968 shown in FIG. 9. The first subset of contact openings 1070 expose a top surface 1070-$t$ of the second dielectric layer pair, where the second dielectric layer pair is located below the first or topmost dielectric layer pair in the alternating dielectric stack 554. In this disclosure, the dielectric layer pairs are counted sequentially from top to bottom in the alternating dielectric stack 554. In some embodiments, one or more dielectric layer pairs 556 can be etched with the first contact mask 968. The etching process for the first dielectric layer 558 can have a high selectivity over the second dielectric layer 560, and/or vice versa. Accordingly, an underlying dielectric layer pair 556 can function as an etch-stop layer. As a result, multiple dielectric layer pairs 556 can be etched controllably.

In some embodiments, dielectric layer pair 556 can be etched by using an anisotropic etching such as a reactive ion etching (RIE) or other dry etching processes. In some embodiments, the first dielectric layer 558 is silicon oxide. In this example, the etching of silicon oxide can include RIE using fluorine-based gases such as carbon-fluorine ($CF_4$), hexafluoroethane ($C_2F_6$), $CHF_3$, or $C_3F_6$ and/or any other suitable gases. In some embodiments, the silicon oxide layer can be etched by wet chemistry, such as hydrofluoric acid or a mixture of hydrofluoric acid and ethylene glycol. In some embodiments, a timed-etch approach can be used. In some embodiments, the second dielectric layer 560 is silicon nitride. In this example, the etching of silicon nitride can include RIE using $O_2$, $N_2$, $CF_4$, $NF_3$, $Cl_2$, HBr, $BCl_3$, and/or combinations thereof. The methods and etchants used for etching the dielectric layer pair 556 should not be limited by the embodiments of the present disclosure.

In some embodiments, after forming the first subset of contact openings 1070, the first contact mask 968 can be removed by using techniques such as dry etching with $O_2$ or $CF_4$ plasma, or wet etching with resist/polymer stripper, for example solvent based chemicals.

In some embodiments, after the process step S430, half of the hard mask openings 866 can be converted to the first subset of contact openings 1070, with the other half remains as hard mask openings 866. Accordingly, top surfaces of the first and second dielectric layer pairs 866-$t$ and 1070-$t$ can be exposed inside the hard mask openings 866 and the first subset of contact openings 1070, respectively.

In some embodiments, the alternating dielectric stack 554 includes L number of dielectric layer pairs 556. In some embodiments, the 3D memory structure 800 (in FIG. 8) includes N number of hard mask openings 866, wherein the number N is larger or equal to the number L, i.e., N≥L. In this example, half of the hard mask openings 866 can be converted to the first subset of contact openings 1070. In the other words, after process step S430, the number of first subset of contact openings 1070 can be N/2 and the number of remaining hard mask openings 866 can also be N/2. However, the first subset of contact openings 1070 is not limited as described above and can include any suitable number of the hard mask openings 866.

Referring to FIG. 4, at process step S435, a second contact mask can be formed over the alternating dielectric stack, according to some embodiments of the present disclosure. An exemplary 3D memory device at process step S435 is illustrated as a 3D memory structure 1100 in FIG. 11.

In some embodiments, the 3D memory structure 1100 includes a second contact mask 1172 disposed on the 3D memory structure 1000, over at least a portion of the alternating dielectric stack 554. In some embodiments, the second contact mask 1172 covers half of the remaining hard mask openings 866 and exposes the other half of the remaining hard mask openings 866. In some embodiments, the second contact mask 1172 also covers half of the first subset of contact openings 1070 and exposes the other half of the first subset of contact openings 1070. In some embodiments, the second contact mask 1172 can include a photoresist or carbon-based polymer material, and can be formed using a patterning process such as lithography.

Referring to FIG. 4, at process step S440, a second subset of contact openings and a third subset of contact openings can be formed in the alternating dielectric stack, according to some embodiments of the present disclosure. An exemplary 3D memory device at process step S440 is illustrated as a 3D memory structure 1200 in FIG. 12. The 3D memory structure 1200 includes a second subset of contact openings 1274 and a third subset of contact openings 1275.

Figure 11:
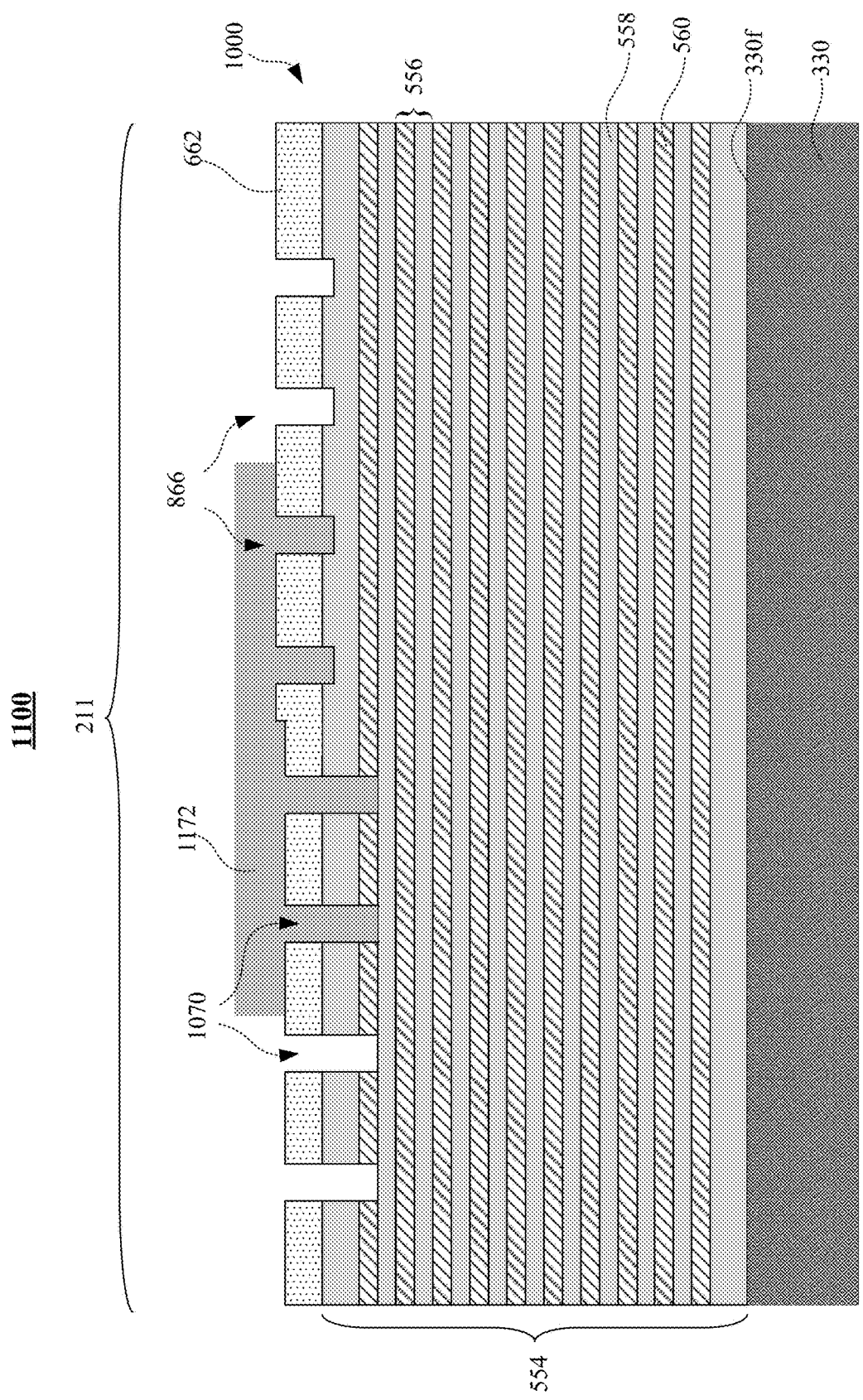

In some embodiments, the second and third subsets of contact openings 1274 can be formed by etching two dielectric layer pairs 556 using the second contact mask 1172 shown in FIG. 11. In some embodiments, one or more dielectric layer pairs 556 can be etched with the second contact mask 1172. The etching processes for the first and second dielectric layers 558 and 560 can be similar to those used for the first subset of contact openings 1070, where each dielectric layer pair 556 can be etched controllably with an etch-stop on the underlying dielectric layer pair 556.

In some embodiments, the first and second contact masks 968 and 1172 can be designed such that the second subset of contact openings 1274 include half of the first subset of contact openings 1070 and the third subset of contact openings 1275 include half of the remaining hard mask openings 866 that are not converted to the first subset of contact openings 1070 at the process step 430. In the example that the hard mask openings 866 are formed by etching through the hard mask 662 and the first subset of contact openings 1070 are formed by etching one dielectric layer pair 556, by etching two dielectric layer pair 556 at process step S440, the second subset of contact openings 1274 can extend through three dielectric layer pairs and expose a top surface 1274-t of the fourth dielectric layer pair. In the meantime, the third subset of contact openings 1275 can extend through two dielectric layer pairs and expose a top surface 1275-t of the third dielectric layer pair. Accordingly, after process step S440, half of the first subset of contact openings 1070 are converted to the second subset of contact openings 1274 and half of the remaining hard mask openings 866 are converted to the third subset of contact openings 1275.

Figure 12:
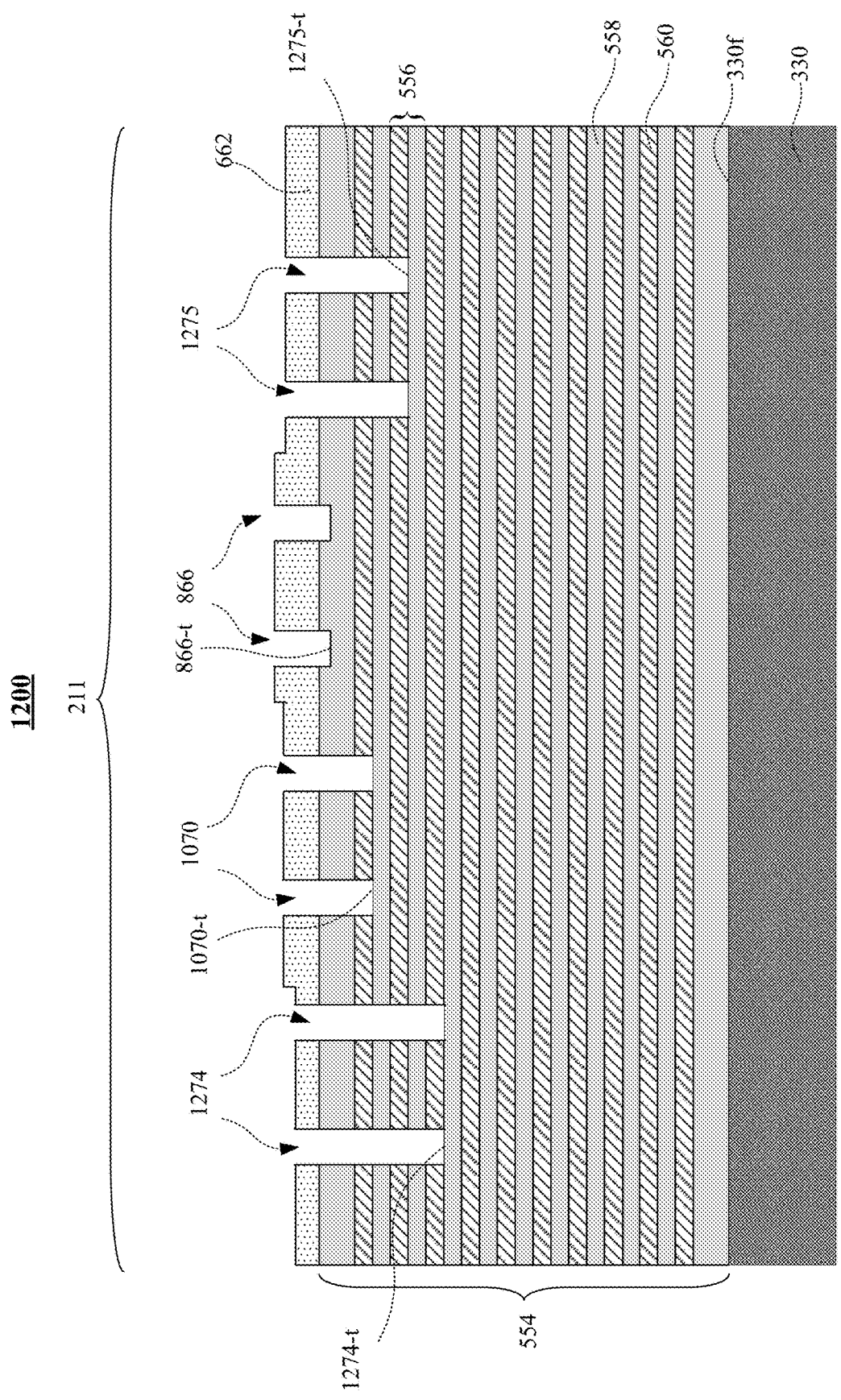

As shown in FIG. 12, the 3D memory structure 1200 can also include some of the first subset of contact openings 1070 extending through one dielectric layer pair 556 and exposing the top surface 1070-t of the second dielectric layer pair. The 3D memory structure 1200 can also include some of the hard mask openings 866 extending through the hard mask 662 and exposing the top surface 866-t of the first dielectric layer pair. As illustrated in FIG. 11, these openings are covered by the second contact mask 1172 at process step S435, and are protected during the etching process of the dielectric layer pairs 556 at process step S440. Therefore, depths of the aforementioned openings are not changed at process step S440.

After process step S440, top surfaces of the first, second, third and fourth dielectric layer pairs can be exposed inside in the hard mask openings 866, the first subset of contact openings 1070, the third subset of contact openings 1275 and the second subset of contact openings 1274, respectively.

In the example that the 3D memory structure 1000 includes N/2 number of first subset of contact openings 1070 and N/2 number of hard mask openings 866, after process step S430, the 3D memory structure 1200 can include N/4 number of second subset of contact openings 1274 and N/4 number of third subset of contact openings 1275. In the meantime, there can be N/4 number of first subset of contact openings 1070 and N/4 number of hard mask openings 866 remaining in the 3D memory structure 1200.

It is noted that arrangement of the first, second and third subsets of contact openings 1070, 1274 and 1275 and the hard mask openings 866 in FIG. 12 is for illustration purpose only. The 3D memory structure 1200 can include different arrangements and depths in the first, second and third subsets of contact openings 1070, 1274 and 1275, as well as the hard mask openings 866.

Referring to FIG. 4, at process step S445, a third contact mask is formed over the alternating dielectric stack, according to some embodiments of the present disclosure. An exemplary 3D memory device at process step S445 is illustrated as a 3D memory structure 1300 in FIG. 13.

The 3D memory structure 1300 includes a third contact mask 1376 disposed on the 3D memory structure 1200, over at least a portion of the alternating dielectric stack 554. In some embodiments, the third contact mask 1376 covers half of the remaining hard mask openings 866 and exposes the other half of the remaining hard mask openings 866. In some embodiments, the third contact mask 1376 also covers half of the remaining first subset of contact openings 1070 and exposes the other half of the remaining first subset of contact openings 1070. In some embodiments, the third contact mask 1376 also covers half of the second subset of contact openings 1274 and exposes the other half of the second subset of contact openings 1274. In some embodiments, the third contact mask 1376 also covers half of the third subset of contact openings 1275 and exposes the other half of the third subset of contact openings 1275. In some embodiments, the third contact mask 1376 can include a photoresist or carbon-based polymer material, and can be formed using a patterning process such as lithography.

Referring to FIG. 4, at process step S450, a fourth subset, a fifth subset, a sixth subset and a seventh subset of contact openings are formed in the alternating dielectric stack, according to some embodiments of the present disclosure. An exemplary 3D memory device at process step S450 is illustrated as a 3D memory structure 1400 in FIG. 14A. The 3D memory structure 1400 includes a fourth subset of contact openings 1478, a fifth subset of contact openings 1479, a sixth subset of contact openings 1480 and a seventh subset of contact openings 1481, formed in the alternating dielectric stack 554, according to some embodiments of the present disclosure.

Figure 13:
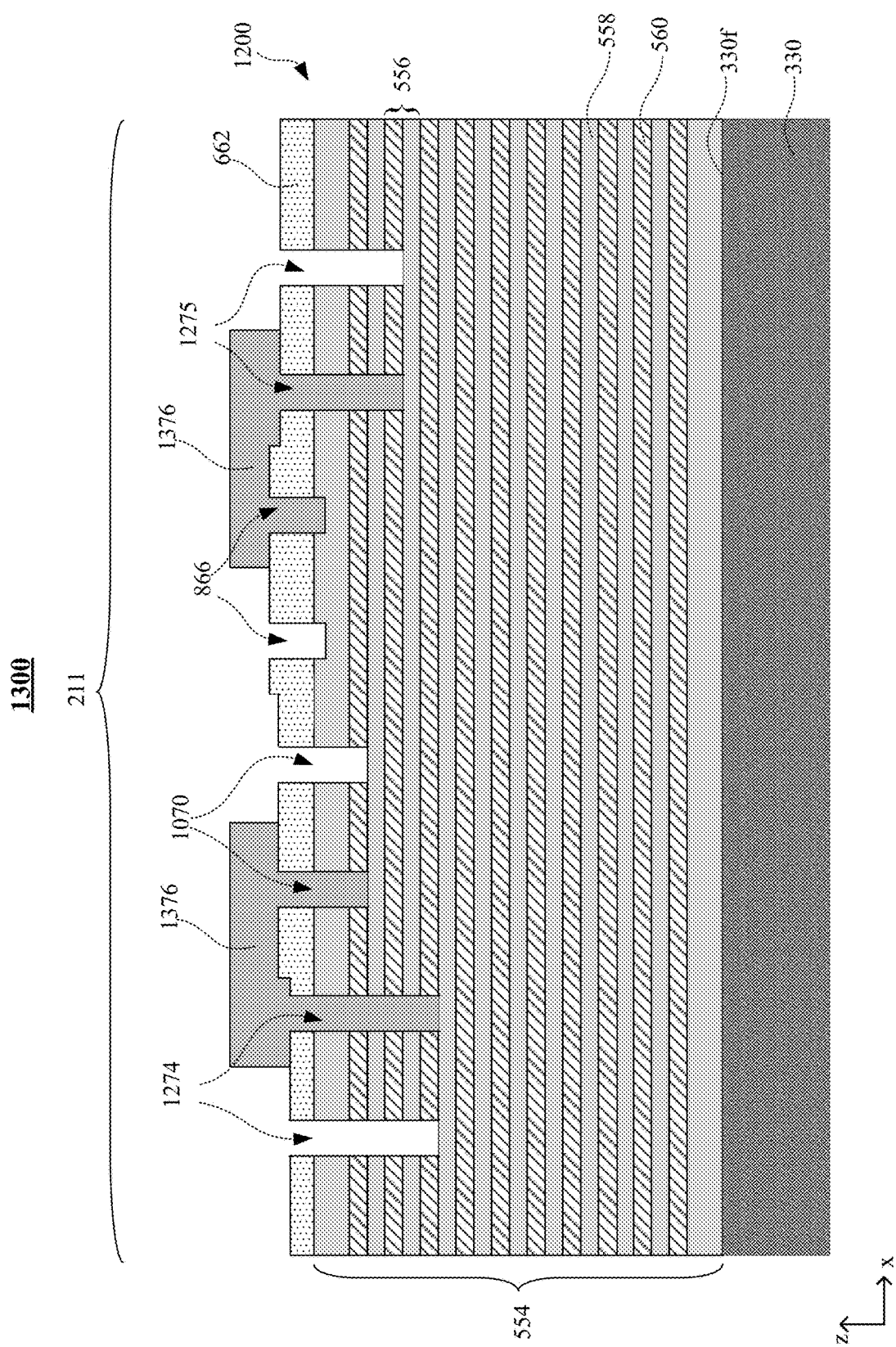

In some embodiments, the fourth, fifth, sixth and seventh subsets of contact openings 1478-1481 can be formed by etching four dielectric layer pairs 556 using the third contact mask 1376 shown in FIG. 13. In some embodiments, one or more dielectric layer pairs 556 can be etched using the third contact mask 1376. The etching processes for the first and second dielectric layers 558 and 560 can be similar to those used for the first, second and third subsets of contact openings 1070, 1274 and 1275, where each dielectric layer pair 556 can be etched controllably with an etch-stop on the underlying dielectric layer pair 556.

Figure 14A:
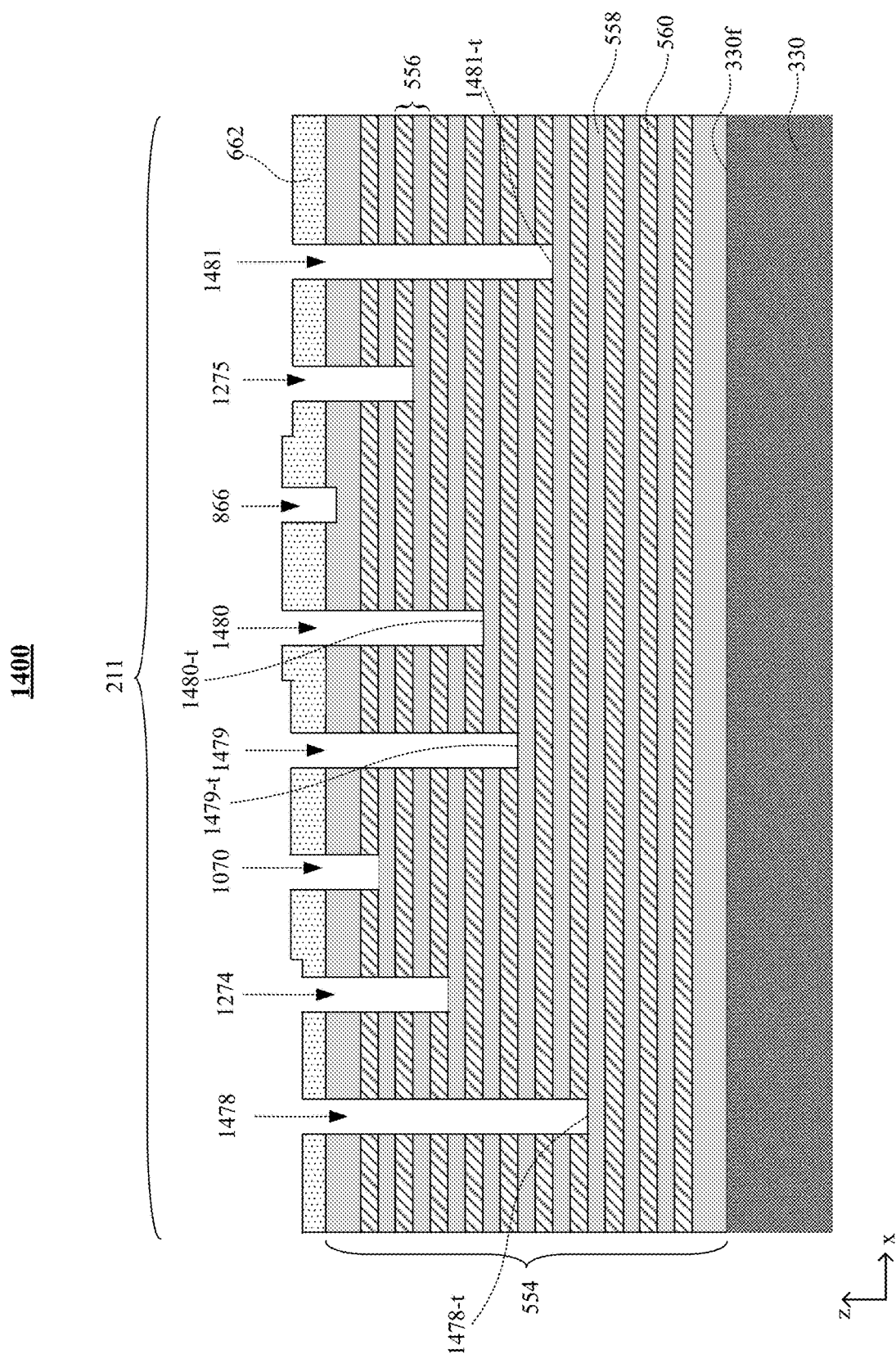
Figure 14B:
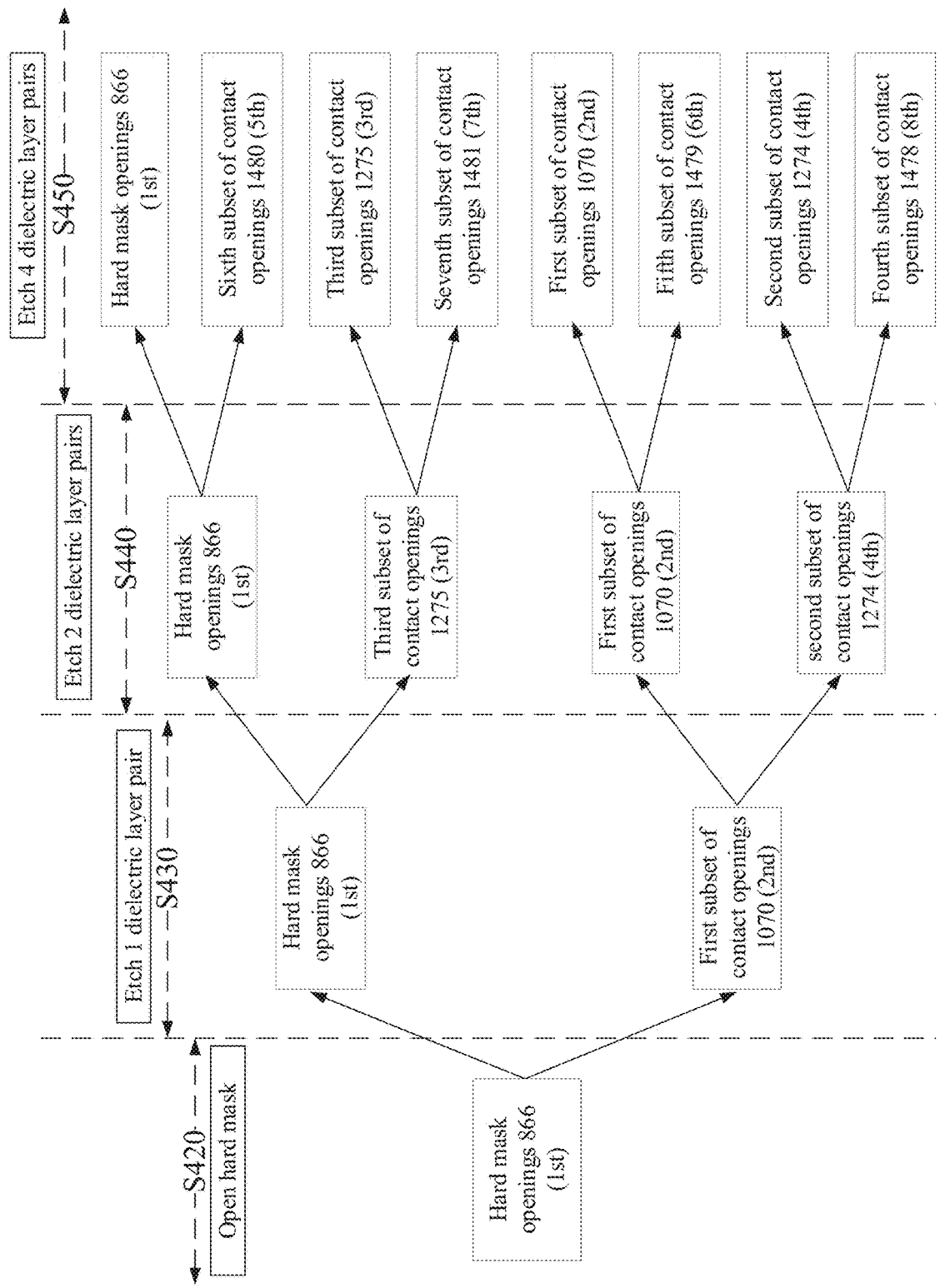
FIG. 14B illustrates relationships between the contact openings at various process steps, according to some embodiments of the present disclosure.
Figure 15:
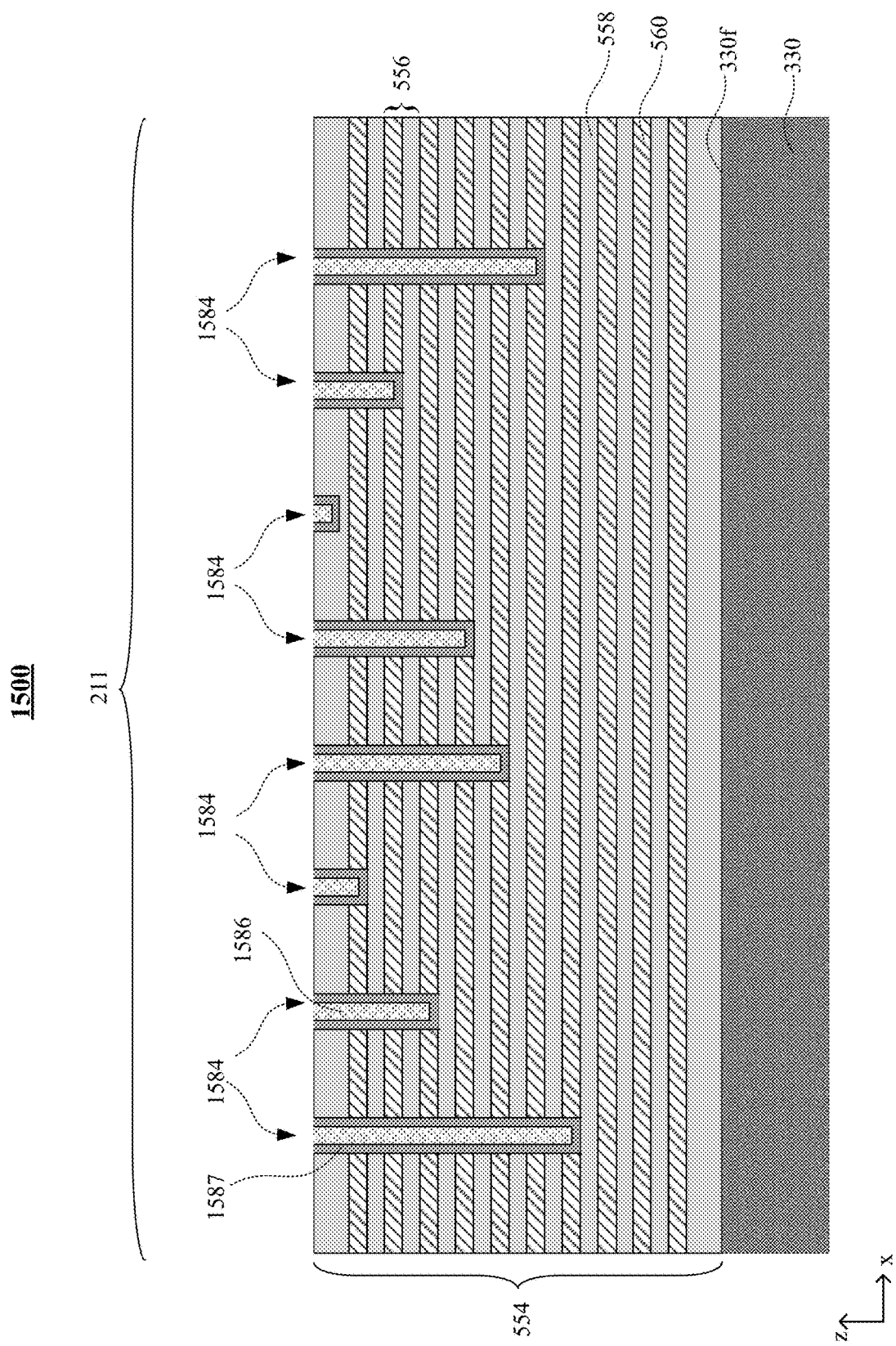
FIGS. 15-20 illustrate cross-sectional views of an exemplary 3D memory device at various process steps, following the flow diagram of FIG. 4, according to some embodiments of the present disclosure.
Figure 16:
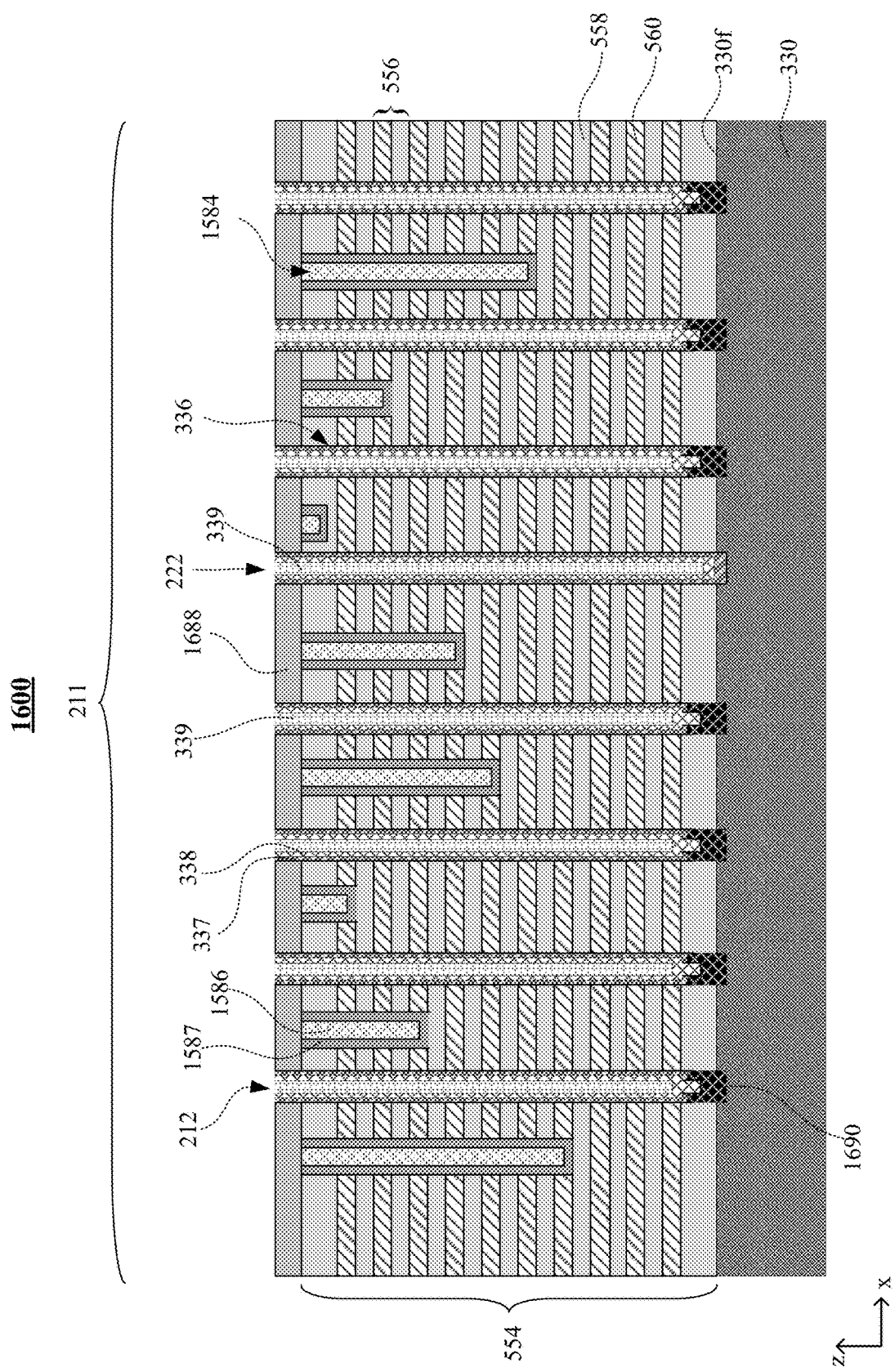

FIG. 14B illustrates the relationships between contact openings at various process steps, according to some embodiments of the present disclosure. The dielectric layer pair 566 (counted from top to bottom) that each contact opening exposes is shown in parenthesis. In some embodiments, the first, second and third contact masks 968, 1172 and 1376 can be designed such that a portion of the hard mask openings 866 can be converted to the first subset of contact openings 1070 at process step S430. A portion of the first subset of contact openings 1070 can be converted to the second subset of contact openings 1274 at process step S440 and then a portion of the second subset of contact openings 1274 can be converted to the fourth subset of contact openings 1478 at process step S450. In the meantime, a portion of the remaining first subset of contact openings 1070 at process step S440 can be converted to the fifth subset of contact openings 1479 at process step S450. In this example, a portion of the remaining hard mask openings 866 at process step S430 can be converted to the third subset of contact openings 1275 at process step S440, while a portion of the third subset of contact openings 1275 can be converted to the seventh subset of contact openings 1481 at process step S450. A portion of the remaining hard mask openings 866 at process step S440 can be converted to the sixth subset of contact openings 1480 at process step S450. It is noted that the portion of contact openings subjected to the etching of dielectric layer pair 566 at each process step can be any suitable number and is not limited to a half or 50% shown in the FIGS. 9-13 and 14A.

As discussed previously, in some embodiments, there are N number of hard mask openings 866 after process step S420 and the 3D memory structure 1000 can have N/2 number of first subset of contact openings 1070 and N/2 number of hard mask openings 866 after process step S420. The 3D memory structure 1200 can have N/4 number of first subset of contact openings 1070, N/4 number of second subset of contact openings 1274, N/4 number of third subset of contact openings 1275, and N/4 number of hard mask openings 866 after process step S440. In some embodiments, the 3D memory structure 1400 can have N/8 number of first subset of contact openings 1070, N/8 number of second subset of contact openings 1274, N/8 number of third subset of contact openings 1275, N/8 number of fourth subset of contact openings 1478, N/8 number of fifth subset of contact openings 1479, N/8 number of sixth subset of contact openings 1480, N/8 number of seventh subset of contact openings 1481 and N/8 number of hard mask openings 866.

As previously discussed, in some embodiments, the hard mask openings 866 can be formed by etching through the hard mask 662 at process step S420, and the first subset of contact openings 1070 can be formed by etching one dielectric layer pair 556 at process step S430. Subsequently, the second and third subsets of contact openings 1274 and 1275 can be formed by etching two dielectric layer pairs 556 at process step S440. Accordingly, the hard mask opening 866 can expose the first dielectric layer pair, i.e., the topmost dielectric layer pair. The first subset of contact openings 1070, converted from the hard mask openings 866, can extend through one dielectric pair 566 and expose the second dielectric pair, below the first dielectric layer pair. The second and third subsets of contact openings 1274 and 1275, converted from respective first subset of contact openings 1070 and the hard mask openings 866, can extend through three and two dielectric layer pairs 566, respectively. In the other words, the second and third subsets of contact openings 1274 and 1275 can expose the fourth and the third dielectric layer pair, respectively. Referring to FIGS. 14A and 14B, in some embodiments, the fourth to seventh subsets of contact openings 1478-1481 can be formed by etching through four dielectric layer pairs 556. As a result, after process step S450, the fourth subset of contact openings 1478, converted from the second subset of contact openings 1274, can extend through seven dielectric layer pairs 556 and expose a top surface 1478-$t$ of the eighth dielectric layer pair. The fifth subset of contact openings 1479, converted from the first subset of contact openings 1070, can extend through five dielectric layer pairs 556 and expose a top surface 1479-$t$ of the sixth dielectric layer pair. The sixth subset of contact openings 1480, converted from the hard mask openings 866, can extend through four dielectric layer pairs 556 and expose a top surface 1480-$t$ of the fifth dielectric layer pair. Similarly, the seventh subset of contact openings 1481, converted from the third subset of contact openings 1070, can extend through six dielectric layer pairs 556 and expose a top surface 1481-$t$ of the seventh dielectric layer pair.

It is noted that arrangement of the first to seventh subsets of contact openings 1070, 1274-1275, 1478-1481 and the hard mask openings 866 in FIGS. 14A and 14B are for illustration purpose only. The 3D memory structure 1400 can have different arrangements and different depths (i.e., etched dielectric layer pair) in the first to seventh subsets of contact openings 1070, 1274-1275, 1478-1481 and the hard mask openings 866. In the other words, the aforementioned contact openings can be randomly distributed in the alternating dielectric stack 554.

The fabrication processes can be continued by forming another contact mask covering at least a portion of the contact holes on the 3D memory structure 1400 and then etching one or more dielectric layer pairs 566. These process steps can be repeated until a top surface of each dielectric layer pair 566 is exposed inside at least one of the contact openings. In some embodiments, at an i-th process step for forming one or more subsets of contact openings, where 1=1, 2, 3, . . . , each of current subsets of contact openings can be split into two groups, where one group can be subject to an etching process of $2^{(i-1)}$ number of dielectric layer pairs and form new subsets of contact openings. The other group in each of current subsets of contact openings can be protected by a mask and exposed to the etching process. After the i-th process step, top surfaces of the $1^{st}$, $2^{nd}$, $2^i$-th dielectric layer pairs can be exposed inside at least one of the contact openings.

In some embodiments, each of the current subsets of contact openings can be split into two groups with equal number of contact openings, where one group remains the same as current subsets of contact openings and the other group forms new subsets of contact openings. For example, N number of hard mask openings can be split into N/2 number of hard mask openings and N/2 number of first subset of contact openings. Next, the first subset of contact openings can be split into N/4 number of second subset of contact openings and N/4 number of first subset of contact openings . . . and so on. In this example, at least one contact opening can be formed for each dielectric layer pair of an alternating dielectric stack with a total $2^{(i-1)}$ number of dielectric layer pairs by using as few as n number of masks and etching steps.

After forming contact openings in the alternating dielectric stack 554, the hard mask 662 can be removed.

Referring to FIG. 4, at process step S455, a filling material can be disposed inside the contact openings, according to some embodiments of the present disclosure. An exemplary 3D memory device at process step S455 is illustrated as a 3D memory structure 1500 in FIG. 15. The 3D memory structure 1500 includes contact fills 1584 formed by disposing a filling material 1586 inside the contact openings (1070, 1274-1275, 1478-1481) and hard mask openings 866 in the 3D memory structure 1400 (as shown in FIG. 14A). In some embodiments, the contact fill 1584 also include a liner 1587 disposed prior to the deposition of the filling material 1586.

The filling material 1586 and the liner 1587 can be any suitable material that can be selectively removed over the first dielectric layer 558 and/or second dielectric layer 560 in the subsequent processes. In some embodiments, the filling material 1586 and the liner 1587 can be an insulator, for example, silicon oxide, silicon oxynitride, silicon nitride, TEOS, amorphous carbon, and/or a combination thereof. In some embodiments, the filling material 1586 can be silicon nitride and the liner 1587 can be silicon oxide. The filling material 1586 and the liner 1587 can be formed by CVD, PVD, sputtering, evaporating, and/or any combination thereof.

In some embodiments, the 3D memory structure 1500 can be planarized after disposing the filling material 1586 and the liner 1587 to form a coplanar top surface.

Referring to FIG. 4, at process step S460, a plurality of memory strings can be formed in the alternating dielectric stack, according to some embodiments of the present disclosure. An exemplary 3D memory device at process step S460 is illustrated as a 3D memory structure 1600 in FIG. 16. The 3D memory structure 1600 includes a plurality of memory strings (e.g., the memory strings 212 in FIGS. 2 and 3).

To form the plurality of memory strings 212, a plurality of channel holes (e.g., the channel holes 336) can be formed first in the alternating dielectric stack 554, penetrating the entire alternating dielectric stack 554 and extending into the substrate 330. In some embodiments, forming of the channel holes 336 includes processes such as photolithography and etching. In some embodiments, a capping layer 1688 formed by a carbon-based polymer material or a hard mask can be used in addition to photoresist for the etching process. The capping layer 1688 can include silicon oxide, silicon nitride, TEOS, silicon-containing anti-reflective coating (SiARC), amorphous silicon, or polycrystalline silicon, or any combination thereof. The etching process to form the channel holes 336 can include a dry etching, a wet etching, or a combination thereof. In some embodiments, the alternating dielectric stack 554 can be etched using an anisotropic etching such as a reactive ion etch (ME). In some embodiments, fluorine or chlorine based gases such as carbon-fluorine ($CF_4$), hexafluoroethane ($C_2F_6$), $CHF_3$, $C_3F_6$, $Cl_2$, $BCl_3$, etc., or any combination thereof, can be used. The methods and etchants to etch the first and second dielectric layers 558/560 should not be limited by the embodiments of the present disclosure.

In some embodiments, the 3D memory structure 1600 further includes an epitaxial layer 1690 inside the channel hole 336. The epitaxial layer 1690 can include any suitable semiconductor material, such as silicon, silicon germanium, germanium, gallium arsenide, gallium nitride, III-V compound, or any combination thereof. The epitaxial layer 1690 can be epitaxially grown from the substrate 330. In some embodiments, the epitaxial layer 1690 can be selectively grown from an exposed surface of the substrate 330 inside the channel hole 336. In some embodiments, the epitaxial layer 1690 can be a polycrystalline semiconductor material, for example, polycrystalline silicon.

In some embodiments, the epitaxial layer 1690 can be epitaxially grown from a doped region (not shown in FIG. 16) in the substrate 330. The doped region can be formed by ion implantation using p-type or n-type dopants, for example boron, phosphorus, arsenic, or any combination thereof. The ion implantation can be performed before the deposition of the alternating dielectric stack 554. In some embodiments, the ion implantation can be performed after channel hole etching.

After forming the channel holes 336 and epitaxial layer 1690, a memory film (e.g., the memory film 337 in FIG. 3) can be disposed on a sidewall of each channel hole 336, and a top surface of the epitaxial layer 558. In some embodiments, the memory film 337 can be a composite layer including a tunneling layer, a storage layer (also known as "charge trap/storage layer"), and a blocking layer. Each channel hole 336 can have a cylinder shape. The tunneling layer, the storage layer, and the blocking layer are arranged along a direction from the center toward the outer of the channel hole in the above order, according to some embodiments. The tunneling layer can include silicon oxide, silicon nitride, or any combination thereof. The blocking layer can include silicon oxide, silicon nitride, high dielectric constant (high-k) dielectrics, or any combination thereof. The storage layer can include silicon nitride, silicon oxynitride, silicon, or any combination thereof. In some embodiments, the memory film 337 includes ONO dielectrics (e.g., a tunneling layer including silicon oxide, a storage layer including silicon nitride, and a blocking layer including silicon oxide).

Next, a channel layer 338 and a core filling film 339 can be disposed inside the channel holes 336. The channel layer 338 covers a sidewall of the memory film 337 inside the channel hole 336 and is connected with the epitaxial layer 1690. The channel layer 338 can be any suitable semiconductor material such as silicon. In some embodiments, the channel layer 338 can be amorphous, polysilicon, or single crystalline silicon. The channel layer 338 can be formed by any suitable thin film deposition processes including, but not limited to, CVD, PVD, ALD, or a combination thereof. In some embodiments, a thickness of the channel layer 338 can be in a range from about 10 nm to about 30 nm. In some embodiments, the core filling film 339 can be disposed to fill each channel hole 336. In some embodiments, the middle of the core filling film 339 can include one or more air gaps. The core filling film 339 can be any suitable insulator, for example, silicon oxide, silicon nitride, silicon oxynitride, spin-on-glass, boron or phosphorus doped silicon oxide, carbon-doped oxide (CDO or SiOC or SiOC:H), fluorine doped oxide (SiOF), or any combination thereof. The core filling film 339 can be deposited by using, for example, ALD, PVD, CVD, spin-coating, sputtering, or any other suitable film deposition techniques. The core filling film 339 can also be formed by using repeated deposition and etch-back processes. The etch-back process can include, but not limited to, a wet etching, a dry etching, or a combination thereof.

In some embodiments, the core filling film 339, the channel layer 338 and the capping layer 1688 are can be coplanar in the 3D memory structure 1600. The planarization process includes chemical mechanical polishing, ME, wet etching, or a combination thereof. The planarization process removes excess core filling film 339, channel layer 338 and the memory film 337 outside the channel hole 336. Accordingly, the channel layer 338 and the memory film 337 can be disconnected between adjacent channel holes 336.

In some embodiments, a plurality of dummy memory strings (e.g., the dummy memory strings 222 in FIG. 2) can also be formed in the alternating dielectric stack 554, adjacent to the memory strings 212 and/or contact openings 1070, 1274-1275, and 1478-1481. While the memory strings 212 can be used for memory storage, dummy memory strings 222 can be used to provide structural support and improve process uniformity during manufacturing. In some embodiments, the dummy memory strings 222 can also include the core filling film 339 and can be formed using similar techniques as the memory strings 212.

Figure 17:
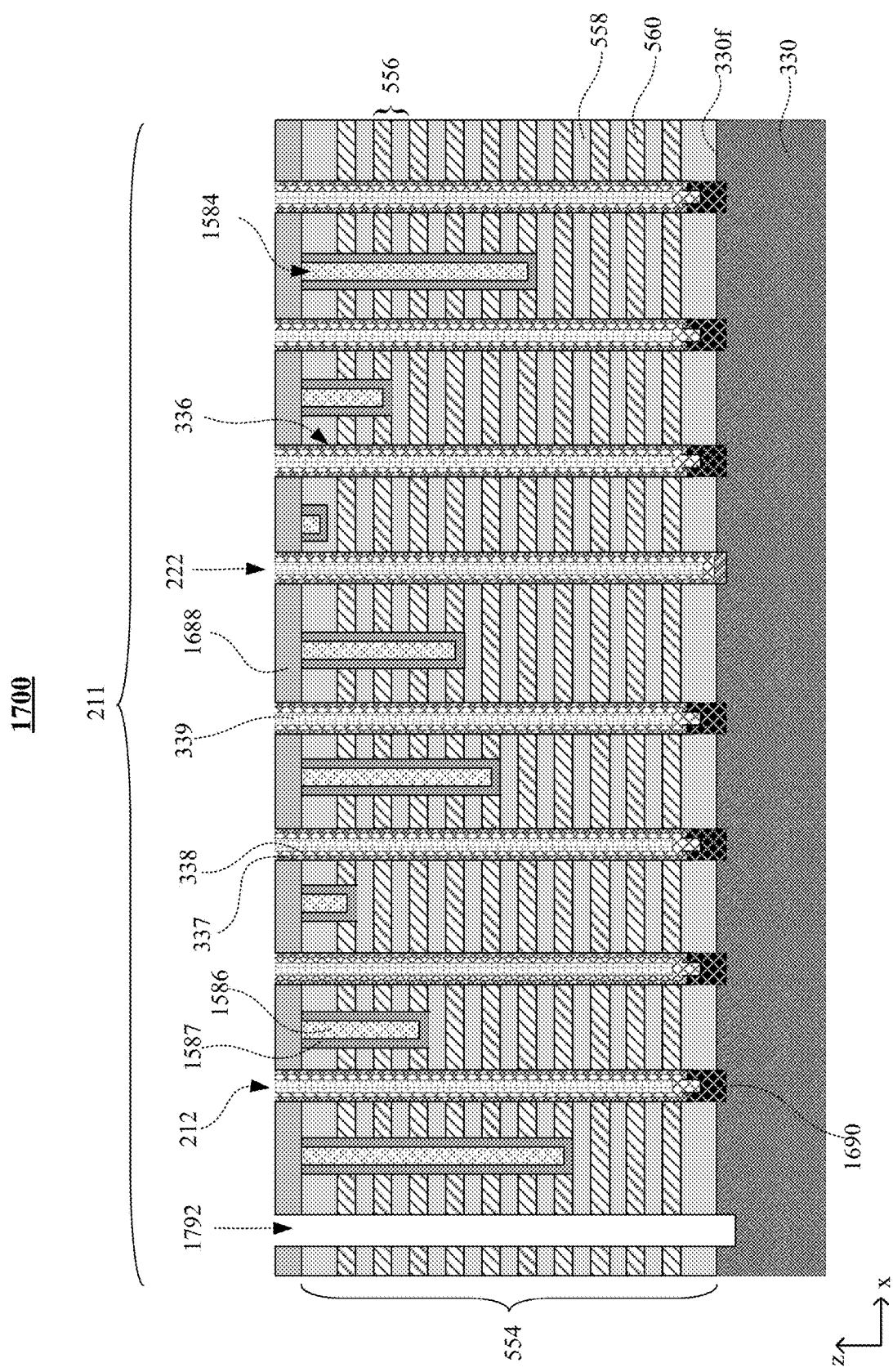

FIG. 17 illustrates a 3D memory structure 1700, according to some embodiments of the present disclosure. The 3D memory structure 1700 includes a plurality of slit openings 1792 penetrating through the entire alternating dielectric stack 554. In some embodiments, the slit openings 1792 can extend laterally along the WL direction in the x-y plane that parallel to the top surface 330f. The slit openings 1792 can form slit structures 216 (in FIGS. 2 and 3) in subsequent fabrication processes. The arrangement of the slit openings 1792 in FIG. 17 is only for illustration purpose and is not so limited.

Referring to FIG. 4, at process step S465, a film stack of alternating conductive and dielectric layers can be formed, according to some embodiments of the present disclosure. An exemplary 3D memory device at process step S465 is illustrated as a 3D memory structure 1800 in FIG. 18. The 3D memory structure 1800 includes a film stack of alternating conductive and dielectric layers, similar to the film stack 335 in FIG. 3.

Figure 18:
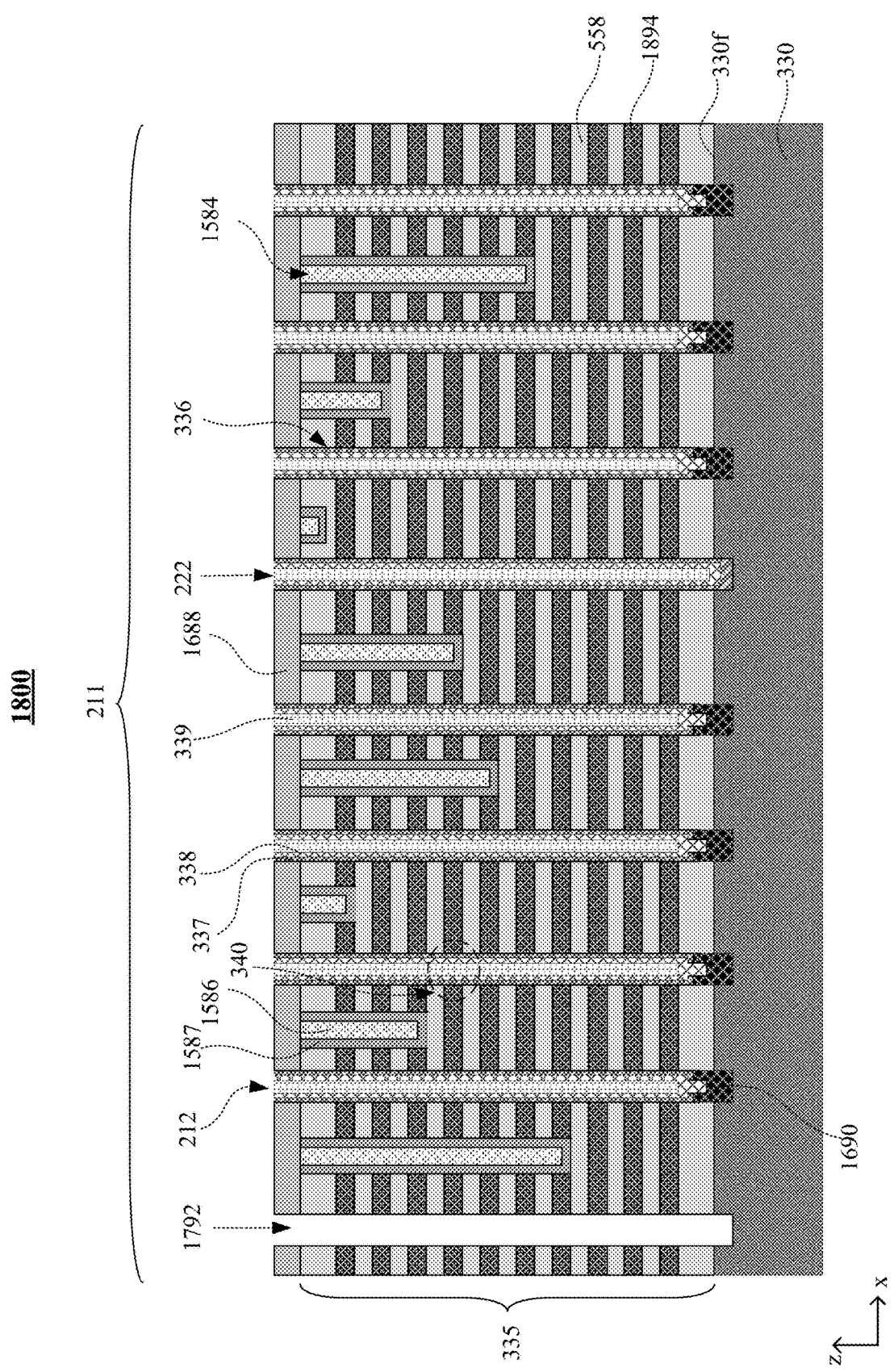

After forming the slit openings 1792, the second dielectric layer 560 in the alternating dielectric stack 554 (in FIG. 17) can be removed laterally from the slit openings 1792, forming lateral tunnels (not shown in FIG. 18). Conductive layers 1894 can then be disposed inside these lateral tunnel to form the film stack 335.

The second dielectric layer 560 (in FIG. 17) can be removed by any suitable etching process, e.g., an isotropic dry etch or wet etch, that is selective over the alternating dielectric stack 554, such that the etching process can have minimal impact on the first dielectric layer 558. In some embodiments, the second dielectric layer 560 can be silicon nitride. In this example, the second dielectric layer 560 can be removed by RIE using one or more etchants of $CF_4$, $CHF_3$, $C_4F_8$, $C_4F_6$, and $CH_2F_2$. In some embodiments, the second dielectric layer 560 can be removed using wet etch, such as phosphoric acid. After removing the second dielectric layer 560, sidewalls of the memory film 337 can be exposed in the lateral tunnels.

In some embodiments, the conductive layer 1894 can include any suitable conductive material that is suitable for a gate electrode, e.g., tungsten (W), aluminum (Al), copper (Cu), cobalt (Co), titanium (Ti), tantalum (Ta), titanium nitride (TiN), tantalum nitride (TaN), and/or any combination thereof. The conductive material can fill the lateral tunnels using a suitable deposition method such as CVD, physical vapor deposition (PVD), plasma-enhanced CVD (PECVD), sputtering, thermal evaporation, e-beam evaporation, metal-organic chemical vapor deposition (MOCVD), and/or ALD. In some embodiments, the conductive layers 1894 include tungsten (W) deposited by CVD.

In some embodiments, the conductive layer 1894 can also be poly-crystalline semiconductors, such as poly-crystalline silicon, poly-crystalline germanium, poly-crystalline germanium-silicon and any other suitable material, and/or combinations thereof. In some embodiments, the poly-crystalline material can be incorporated with any suitable types of dopant, such as boron, phosphorous, or arsenic. In some embodiments, the conductive layer 1894 can also be amorphous semiconductors.

In some embodiments, the conductive layer 1894 can be made from a metal silicide, including $WSi_x$, $CoSi_x$, $NiSi_x$, or $AlSi_x$, etc. The forming of the metal silicide material can include forming a metal layer and a poly-crystalline semiconductor using similar techniques described above. The forming of metal silicide can further include applying a thermal annealing process on the deposited metal layer and the poly-crystalline semiconductor layer, followed by removal of unreacted metal.

In some embodiments, a gate dielectric layer can be disposed in the lateral tunnels prior to the conductive layer 1894 (not shown in FIG. 18) to reduce leakage current between adjacent word lines (gate electrodes) and/or to reduce leakage current between gate and channel. The gate dielectric layer can include silicon oxide, silicon nitride, silicon oxynitride, and/or any suitable combinations thereof. The gate dielectric layer can also include high-k dielectric materials, such as hafnium oxide, zirconium oxide, aluminum oxide, tantalum oxide, lanthanum oxide, and/or any combination thereof. The gate dielectric layer can be disposed by one or more suitable deposition processes, such as CVD, PVD, and/or ALD.

The conductive layers 1894 can function as gate electrodes at the intersection with memory strings 212. In FIG. 18, the ten conductive layers 1894 can form ten gate electrodes for each memory string 212, e.g., TSG 334, LSG 332 and eight control gates 333. Corresponding to eight control gates 333, each memory string 212 can have eight memory cells 340. It is noted that the number of memory strings and memory cells are shown for illustrative purposes in FIG. 18, and can be increased for higher storage capacity.

After forming the film stack 335 of alternating conductive and dielectric layers, conductive materials inside the slit openings 1792 during deposition can be removed. In some embodiments, insulating materials can be disposed inside some of the slit openings 1792 to form slit structures 216, separating a memory block into multiple programmable and readable memory fingers (see FIG. 2A-2B).

Figure 19:
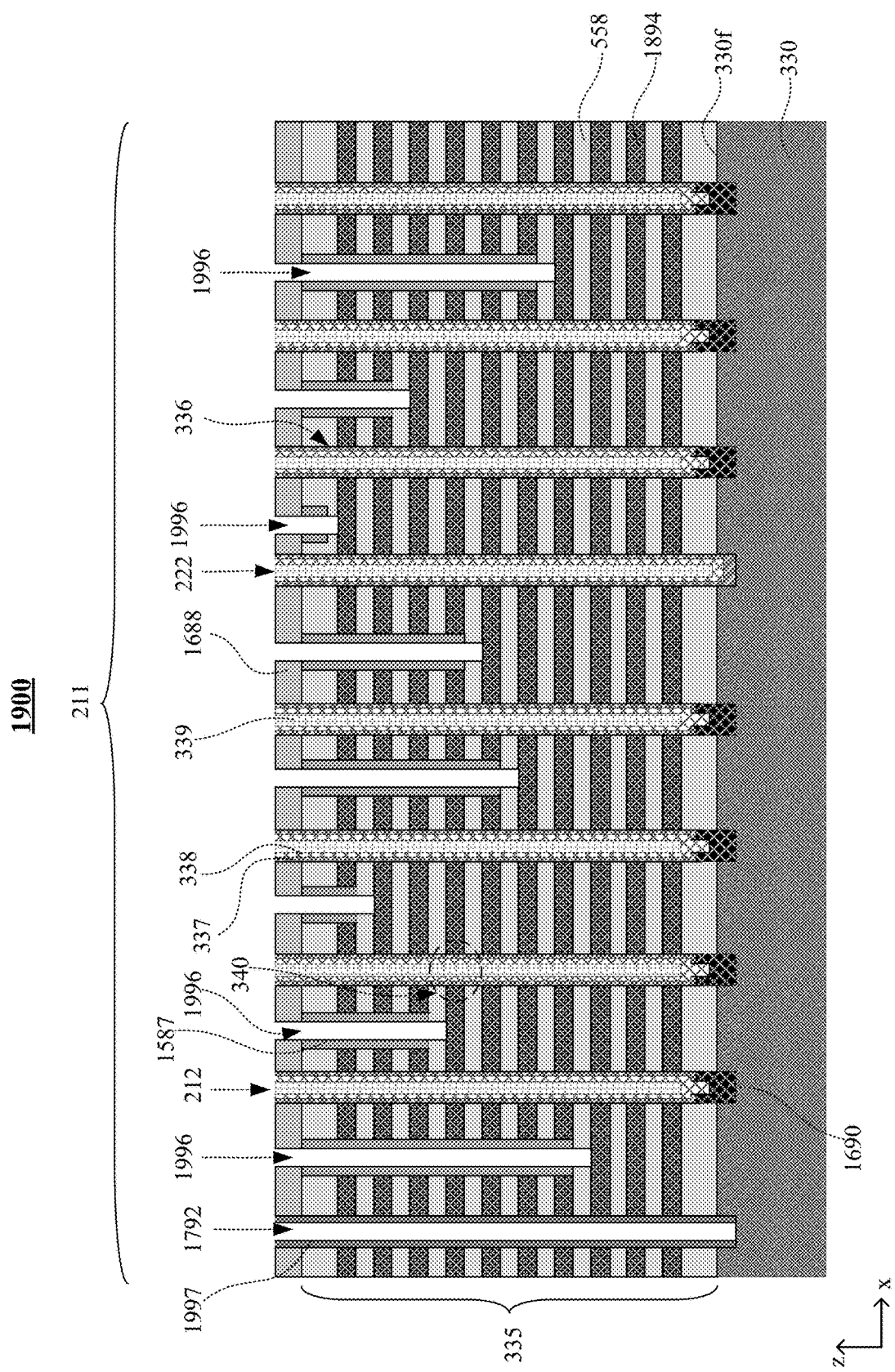

FIG. 19 illustrates a 3D memory structure 1900, according to some embodiments of the present disclosure. The 3D memory structure 1900 includes a plurality of contact holes 1996, formed by removing the filling materials 1586 inside the contact fills 1584 in the 3D memory structure 1800 in FIG. 18. In some embodiments, the contact holes 1996 can be formed by lithography, wet chemical etch, dry etch, or a combination thereof. In some embodiments, the contact holes 1996 extend through the capping layer 1688, one or more pairs of conductive layer 1894 and first dielectric layer 558. The contact holes 1996 can expose the conductive layer 1894 in the film stack 335. In some embodiments, the liner 1587 covers a sidewall of each conductive layer 1894 inside each contact hole 1996. A top surface of a conductive layer 1894 can be exposed at a bottom of each contact hole 1996. As shown in FIG. 19, the contact hole 1996 can go through at least one more first dielectric layer 558 to expose one conductive layer 1894 at the bottom of the contact hole 1996. As such, the liner 1587 is distant from the bottom of the contact hole 1996 in a direction perpendicular to the substrate, and is thereby distant from the exposed conductive layer 1894 at the bottom of the contact hole 1996.

In some embodiments, an isolation liner 1997 can be formed on a sidewall of the slit opening 1792, where the isolation liner 1997 inside the slit opening 1792 covers a sidewall of each conductive layer 1894 of the film stack 335.

In some embodiments, the isolation liner 1997 can also be formed inside the contact hole 1996. The isolation liner 1997 can be any suitable insulator, for example, silicon oxide, silicon nitride, silicon oxynitride or any combination thereof.

Referring to FIG. 4, at process step S470, a contact structure can be formed to electrically connect with the conductive layer in the film stack of alternating conductive and dielectric layers, according to some embodiments of the present disclosure. An exemplary 3D memory device at process step S470 is illustrated as a 3D memory structure 2000 in FIG. 20. The 3D memory structure 2000 includes a plurality of contact structures, similar to the contact structures 214 in FIG. 3, where the contact structure 214 provides electric connection with the conductive layer 1894 in the film stack 335. In some embodiments, each contact structure 214 includes a liner surrounding a conductive material. In some embodiments, the isolation liner 1997 and/or the liner 1587, covered a sidewall of the contact structure 214, can electrically isolate the contact structure 214 from one or more conductive layers 1894 of the film stack 335. The 3D memory structure 2000 can also include a common source contact 2098, electrically connected with the substrate 330. In some embodiments, the isolation liner 1997 can electrically isolate the common source contact 2098 from the conductive layers 1894 of the film stack 335. As described above, the liner 1587 is distant from the exposed conductive layer 1894 at the bottom of the contact hole 1996. Therefore, after forming the contact structure 214, the liner 1587 is distant from the respective conductive layer 1894 that is electrically connected to the contact structure 214. (See FIG. 20.)

The contact structure 214 and the common source contact 2098 can be formed by disposing a conductive material inside the contact hole 1996 and the slit opening 1792. In some embodiments, the conductive material can include tungsten (W), aluminum (Al), copper (Cu), cobalt (Co), titanium (Ti), tantalum (Ta), titanium nitride (TiN), tantalum nitride (TaN), and/or any combination thereof. The conductive material can be disposed by CVD, PVD, PECVD, MOCVD, sputtering, thermal evaporation, e-beam evaporation, ALD, and/or a combination thereof. In some embodiments, the conductive material can be tungsten (W) deposited by CVD.

In some embodiments, the conductive material used for the contact structure 214 and common source contact 2098 can also be poly-crystalline semiconductors, such as poly-crystalline silicon, poly-crystalline germanium, poly-crystalline germanium-silicon and any other suitable material, and/or combinations thereof. In some embodiments, the poly-crystalline material can be incorporated with any suitable types of dopant, such as boron, phosphorous, or arsenic. In some embodiments, the conductive material can also be amorphous semiconductors.

In some embodiments, the conductive material can be made from a metal silicide, including $WSi_x$, $CoSi_x$, $NiSi_x$, or $AlSi_x$, etc. The forming of the metal silicide material can include forming a metal layer and a poly-crystalline semiconductor using similar techniques described above. The forming of metal silicide can further include applying a thermal annealing process on the deposited metal layer and the poly-crystalline semiconductor layer, followed by removal of unreacted metal.

In some embodiments, excess conductive material outside the contact hole 1996 and slit opening 1792 can be removed after the deposition by using an etching process or planarization process. The etching process to remove the excess conductive material can include wet chemical etch and/or dry etch (e.g., RIE). The planarization process can include chemical mechanical polishing (CMP).

Figure 20:
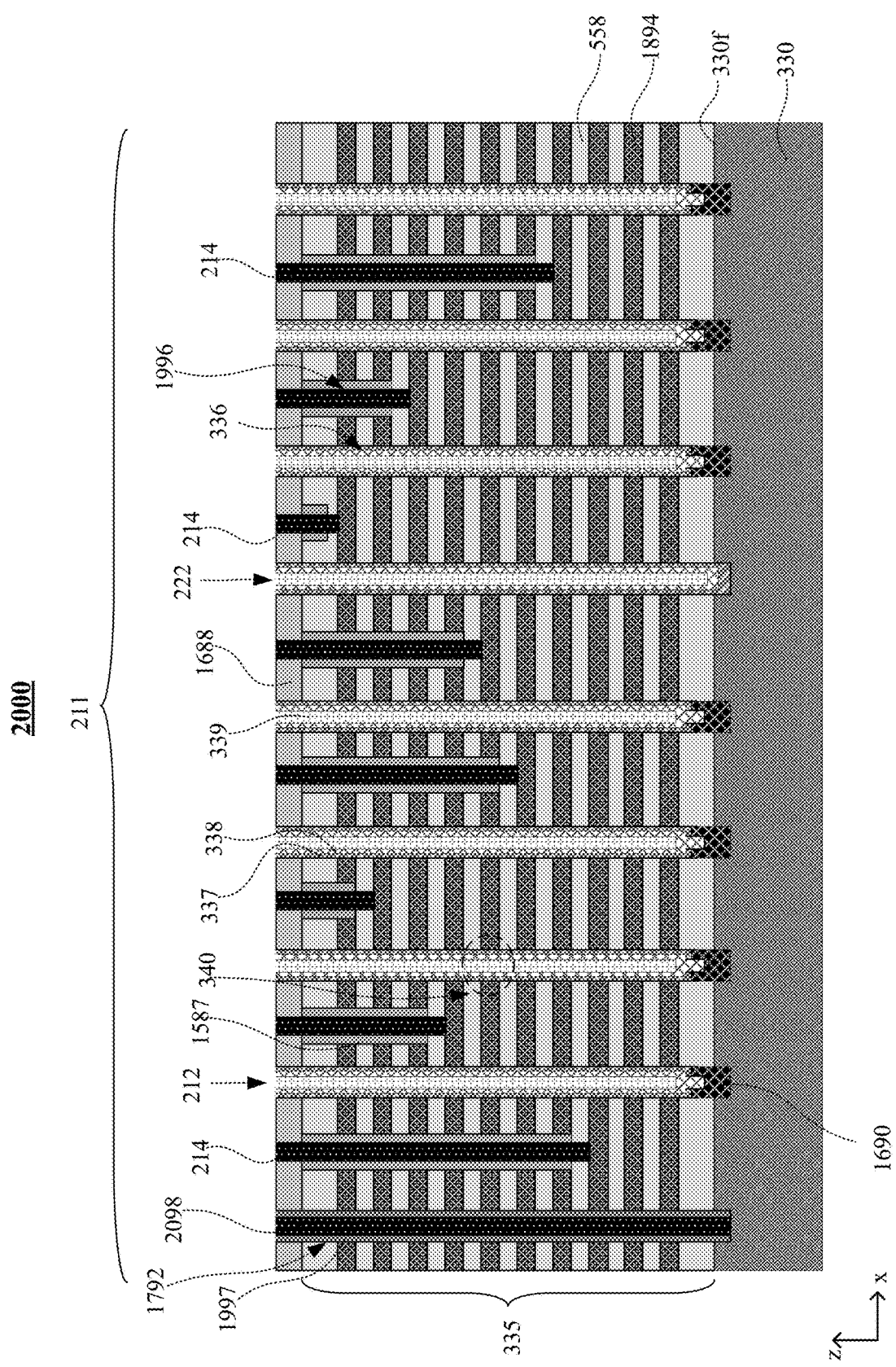

It is noted that the contact structures 214 in FIG. 20 and contact holes 1996 in FIG. 19 correspond to the hard mask openings 866 and/or contact openings 1070, 1274-1275, 1478-1481 in FIG. 14A. As discussed previously, in some embodiments, at least one contact opening can be formed for each dielectric layer pair in an alternating dielectric stack with a total $2^{(n-1)}$ number of dielectric layer pairs by using only n number of masks and etching steps. In addition, according to the present disclosure, at least one contact structure 214 can be formed for each conductive layer 1894 in the film stack 335 without using a staircase structure. In this example, the contact structures 214 can be formed anywhere in the channel structure region 211 (shown in FIG. 2), i.e., inside a memory array, and can be formed adjacent to, or surrounded by, the memory strings 212. In some embodiments, the contact structures 214 can be randomly distributed in the memory array, adjacent to the memory strings 212 and/or dummy memory strings 222. The conductive layer 1894 of the film stack 335 can be functioned as gate electrodes, for example, the control gate (word line) 333 and the top and lower select gates 334 and 332 shown in FIG. 3. By moving the contact structures 214 close to the memory strings 212, delay from word lines to gate electrodes of the memory cells 340 can be shortened accordingly. As a result, the performance of the 3D memory device can be improved. In some embodiments, dummy memory strings 222 can also be formed adjacent to the contact structures 214 and/or the memory strings 212 in the memory array.

Figure 21C:
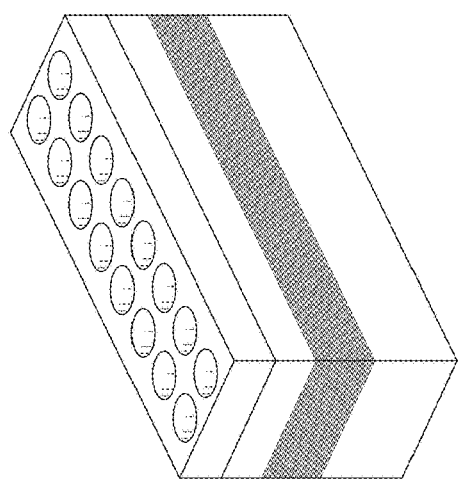
FIGS. 21A-21N illustrate perspective views of an exemplary 3D memory device at various process steps, according to some embodiments of the present disclosure.
Figure 21F:
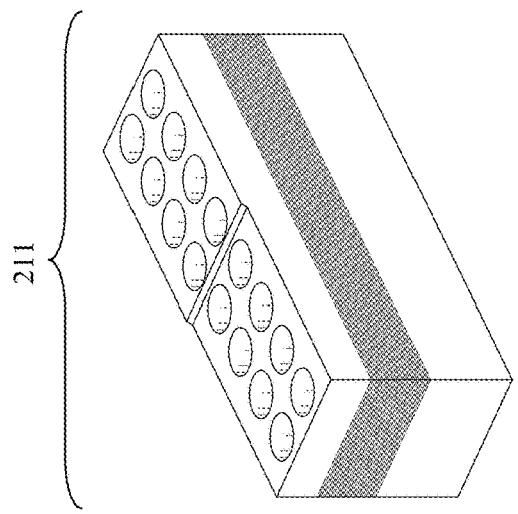
Figure 21B:
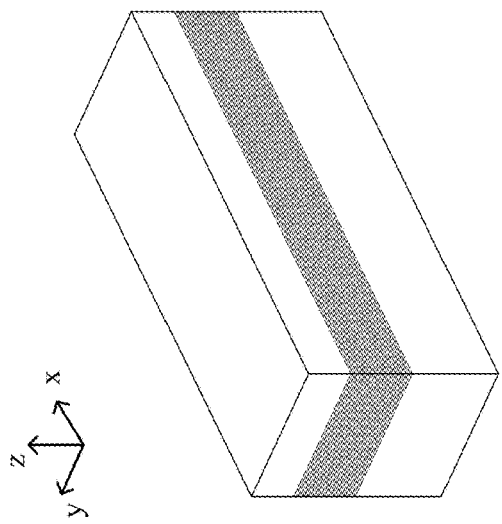
Figure 21E:
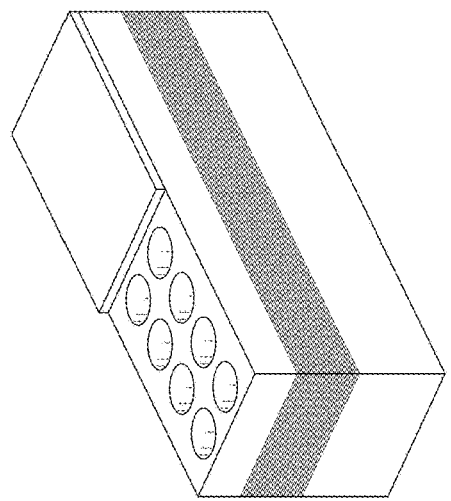
Figure 21A:
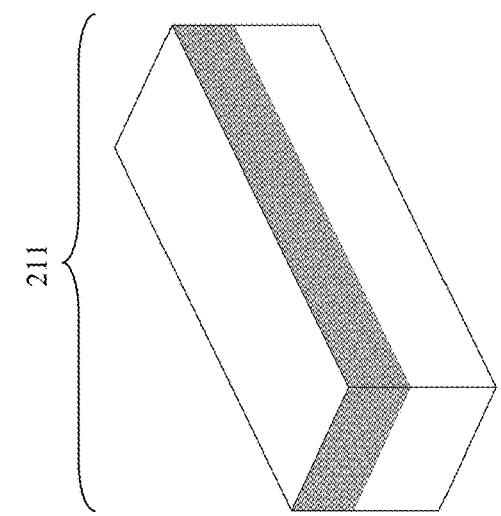
Figure 21D:
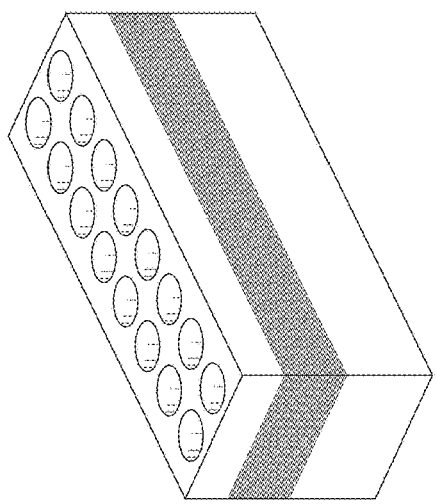
Figure 21I:
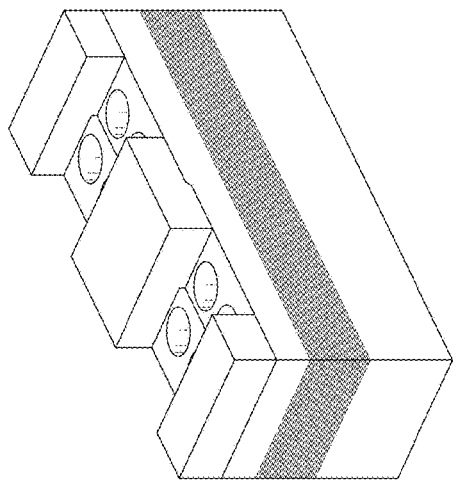
Figure 21L:
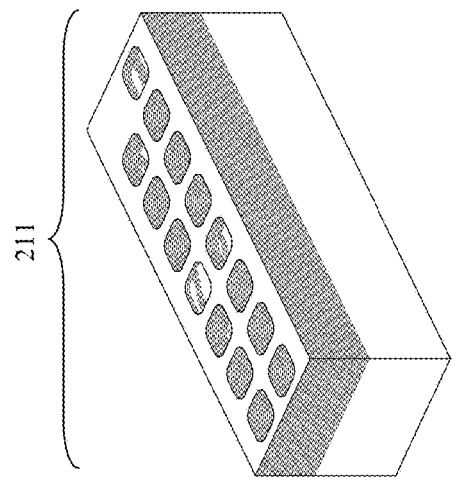
Figure 21H:
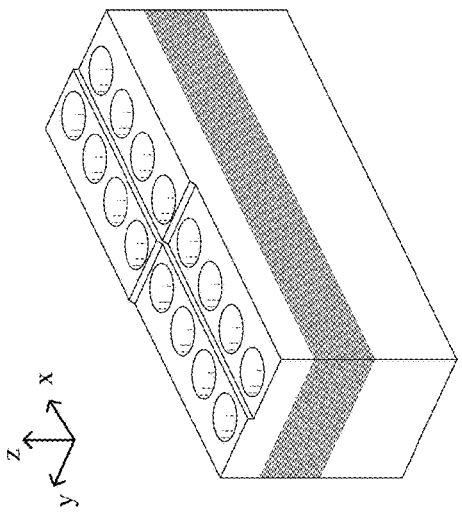
Figure 21K:
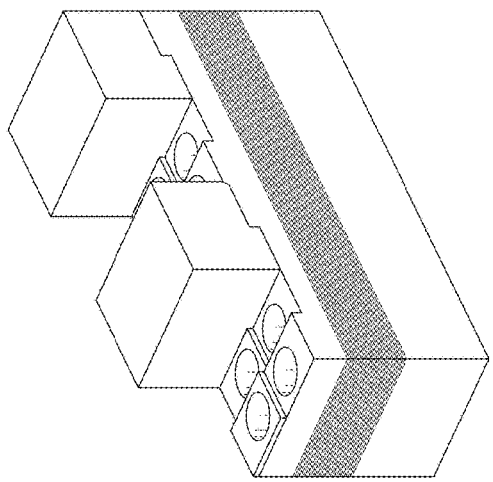
Figure 21G:
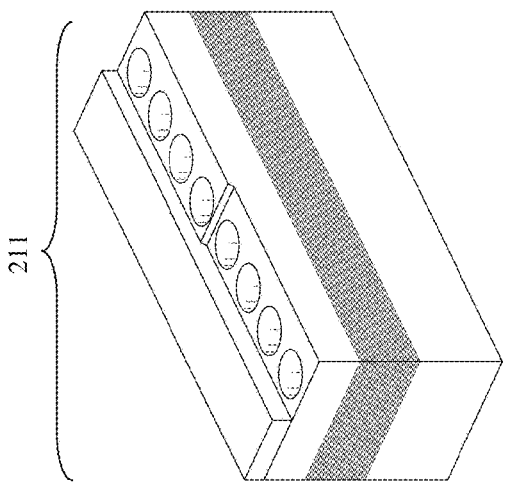
Figure 21J:
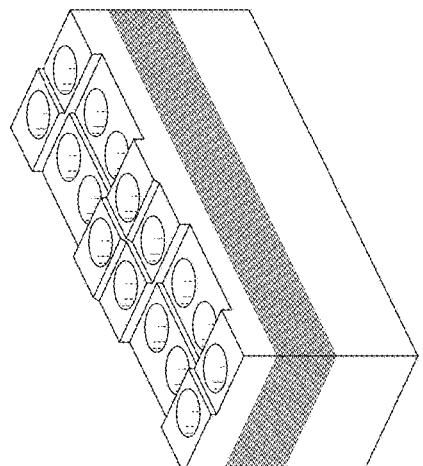
Figure 21N:
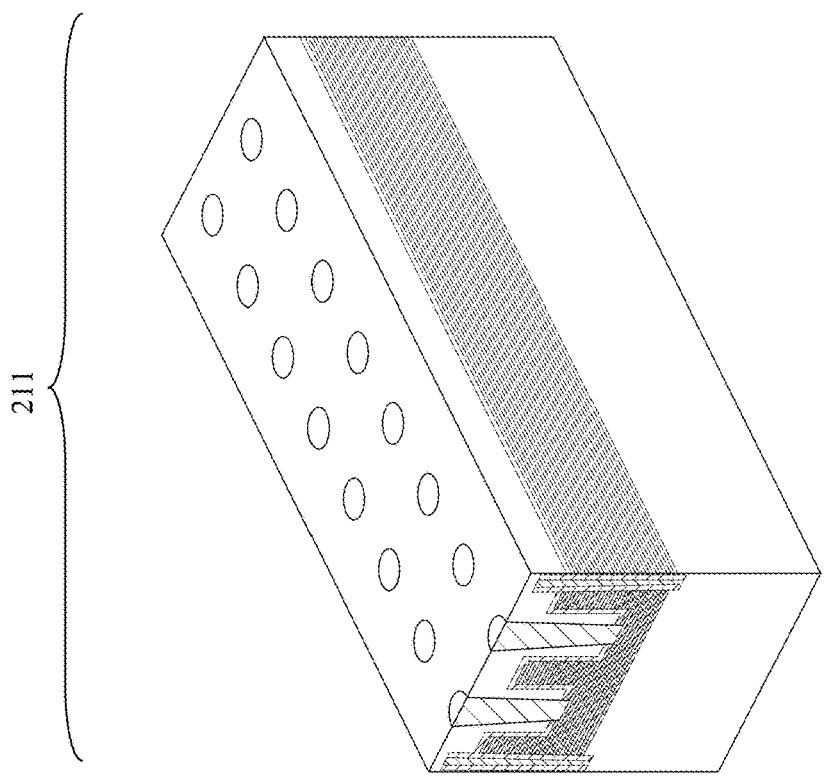
Figure 21M:
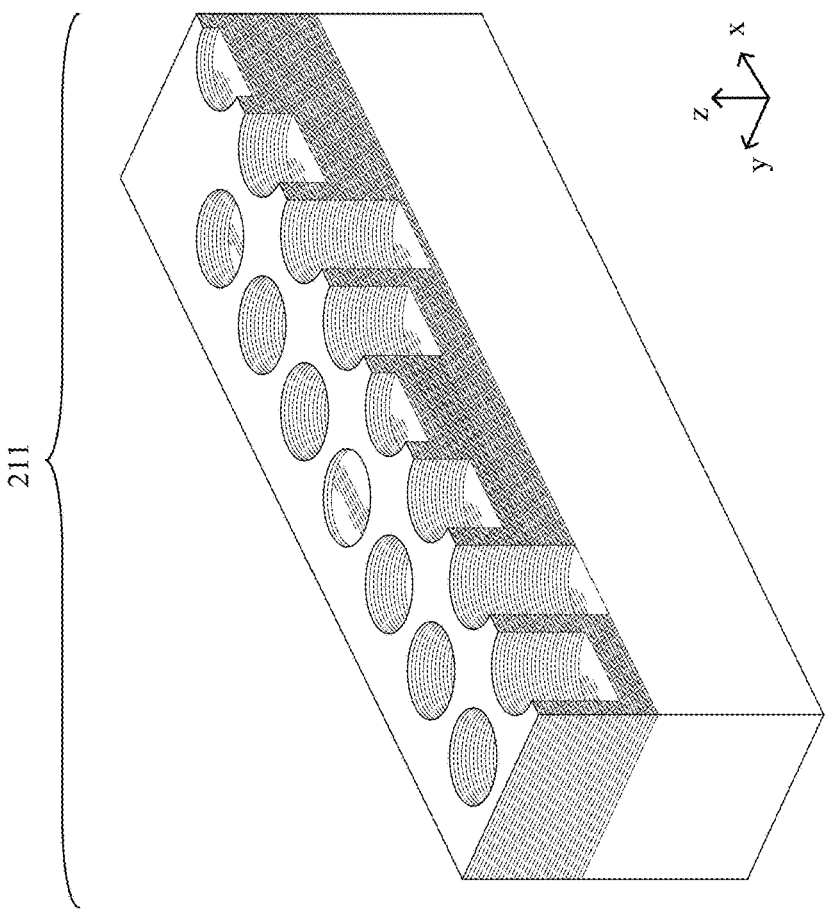

In some embodiments, the contact masks used in the fabrication process 400 described in FIG. 4 can have different designs and arrangements. FIGS. 21A-21N provide perspective views of 3D memory structures at various process steps (e.g., process steps S410-S470), showing a different method to form the contact openings, compared with the examples in FIGS. 5-13, 14A-14B and 15-20. Detailed description for FIGS. 21A-21N is omitted here as the method shown is self-explanatory from these figures and can be understood by a person skilled in the art.

FIG. 22 illustrates another exemplary fabrication process 2200 for forming a 3D memory device, accordance to some embodiments of the present disclosure. FIGS. 23-29 illustrate cross-sectional views of the 3D memory device at various process steps according to the fabrication process 2200. It should be understood that the process steps shown in fabrication process 2200 are not exhaustive and that other process steps can be performed as well before, after, or between any of the illustrated process steps. In some embodiments, some process steps of exemplary fabrication process 2200 can be omitted or other process steps can be included, which are not described here for simplicity. In some embodiments, process steps of fabrication process 2200 can be performed in a different order and/or vary.

Only the differences from FIGS. 4-13, 14A-14B, and 15-20 are illustrated in FIGS. 22-29. Similar process steps and structures can be referred back to the previous figures and corresponding descriptions.

Referring to FIG. 22, fabrication process 2200 starts at process step S2210, where an alternating dielectric stack is disposed on a substrate. The exemplary 3D memory structure 500 of a 3D memory device at process step S2210 is shown in FIG. 5. The alternating dielectric stack 554 can include first and second dielectric layers 558 and 560.

Figure 23:
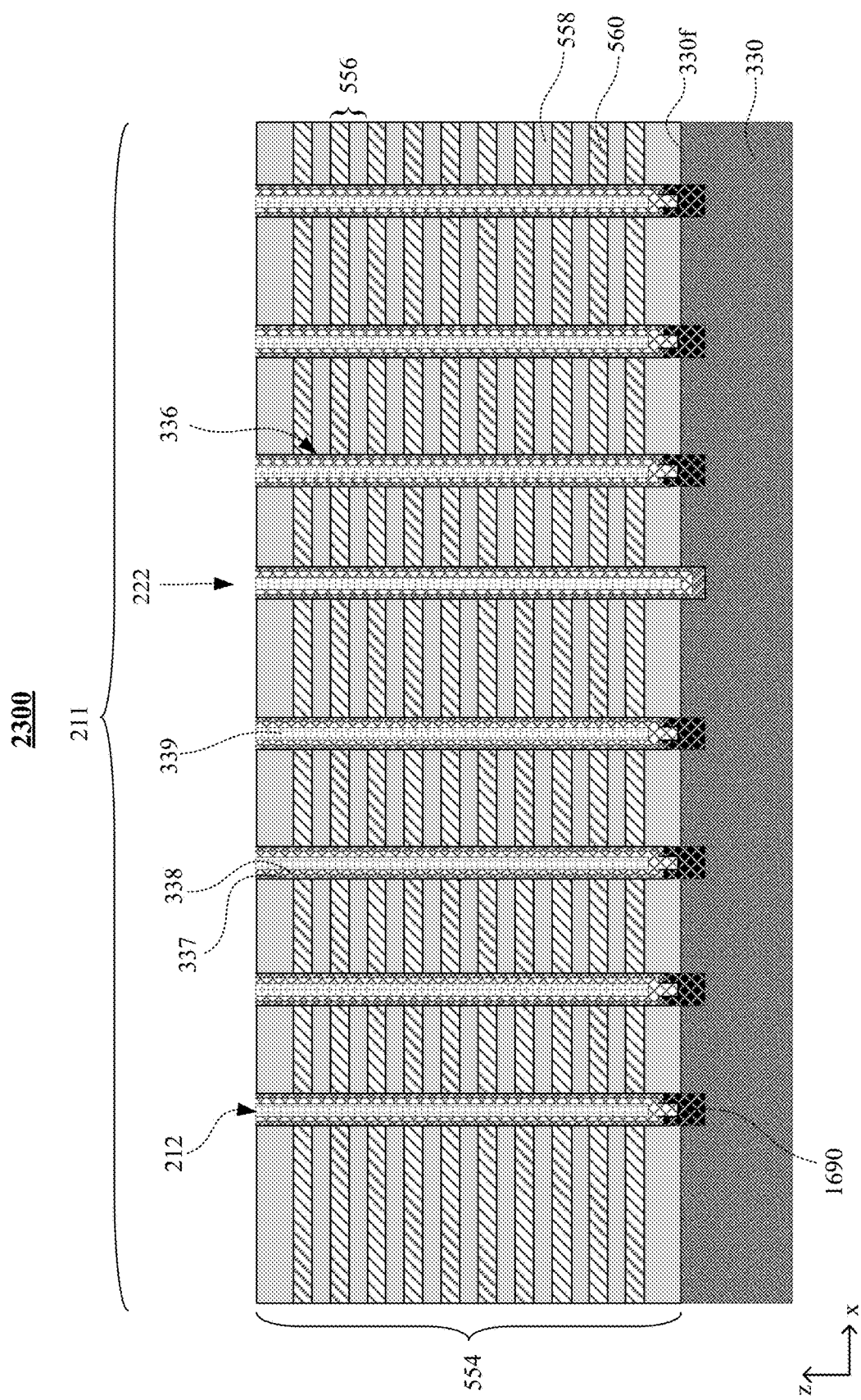
FIGS. 23-29 illustrate cross-sectional views of the exemplary 3D memory device at various process steps, following the flow diagram of FIG. 22, according to some embodiments of the present disclosure.

Referring to FIG. 22, at process step S2220, channel holes and memory strings can be formed in the alternating dielectric stack. An exemplary 3D memory structure 2300 at process step S2220 is shown in FIG. 23, where the channel holes 336 and the memory strings 212 are similar to the respective ones in FIG. 16 and can be formed by using similar techniques. At process step S2220, dummy memory strings, similar to the dummy memory strings 222 in FIG. 16 can also be formed by using similar techniques.

Figure 24:
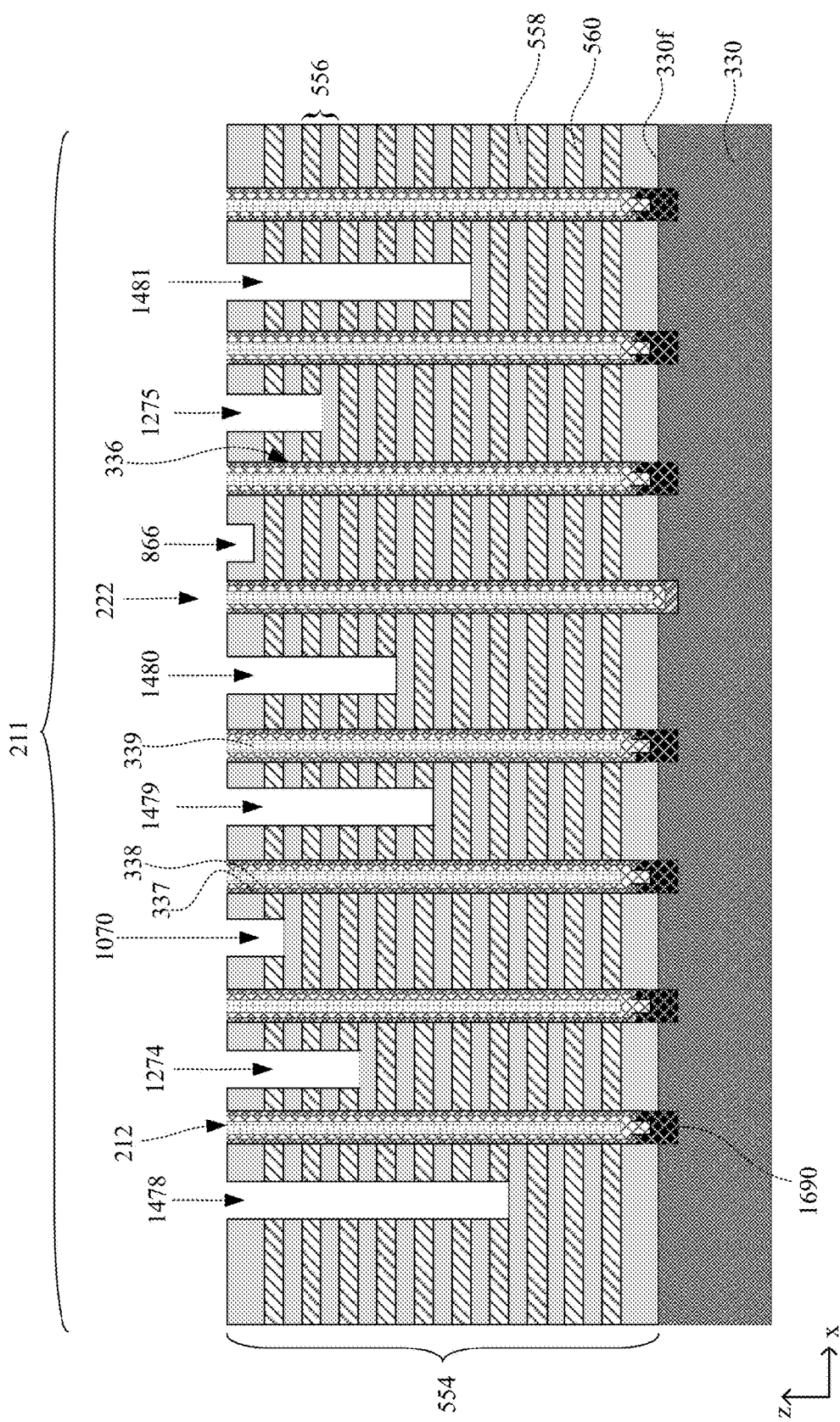

Referring to FIG. 22, at process step S2230, a plurality of contact openings can be formed in the alternating dielectric stack by using multiple contact masks. An exemplary 3D memory structure 2400 at process step S2230 is shown in FIG. 24, where the hard mask openings 866, the first subset of contact openings 1070, the second and third subsets of contact openings 1274-1275, and the fourth to seventh subsets of contact openings 1478-1481 can be similar to the respective ones in FIG. 14A and can be formed by using similar processes in the process steps S415-S450 described in FIG. 4 and FIGS. 6-13 and 14A-14B.

Figure 25:
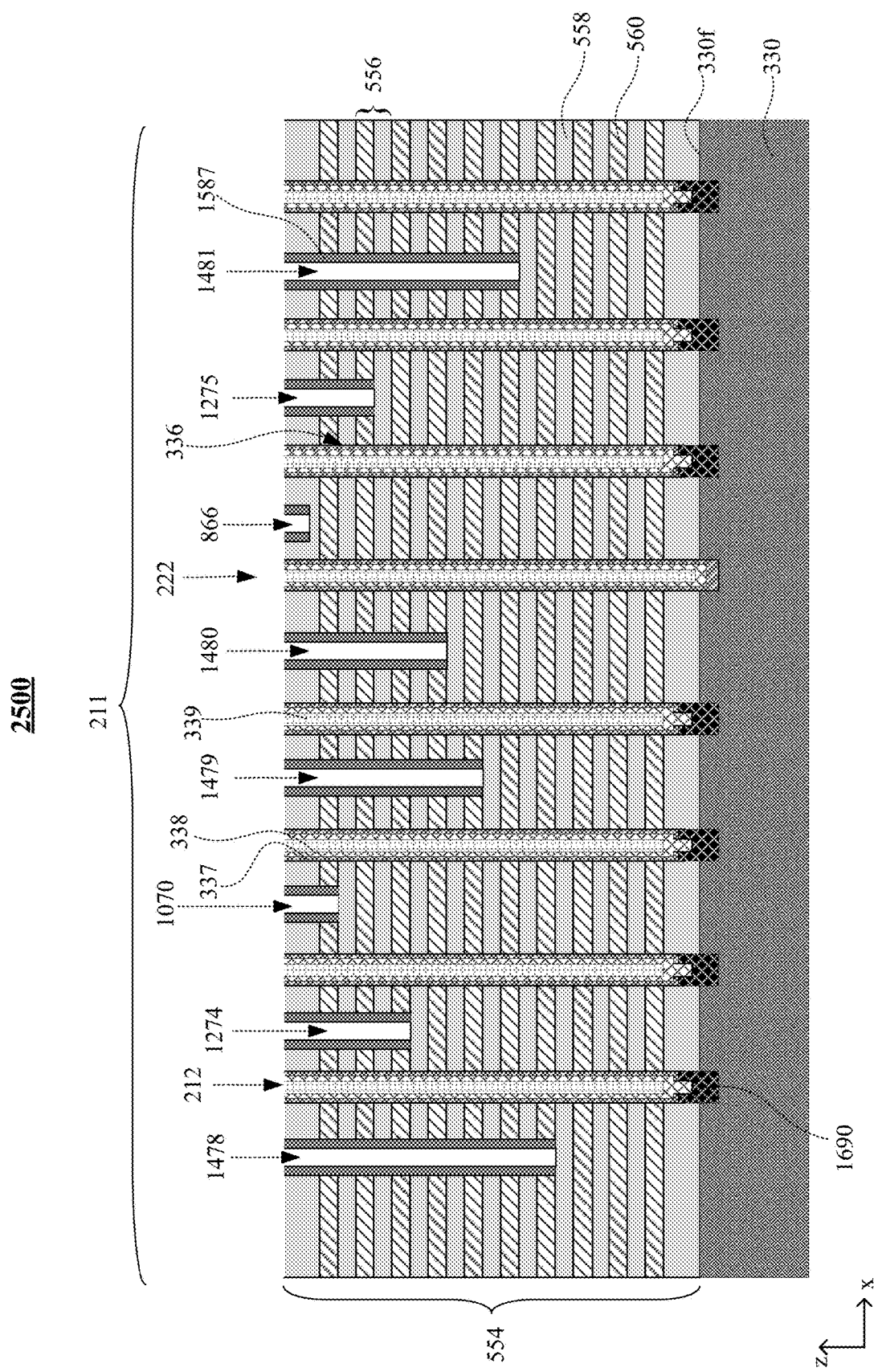

Referring to FIG. 22, at process step S2240, a liner is disposed on a sidewall of each contact openings. An exemplary 3D memory structure 2500 at process step S2240 is shown in FIG. 25, where the liner 1587 is similar to the one in FIG. 15 and can be formed using similar techniques.

Figure 26:
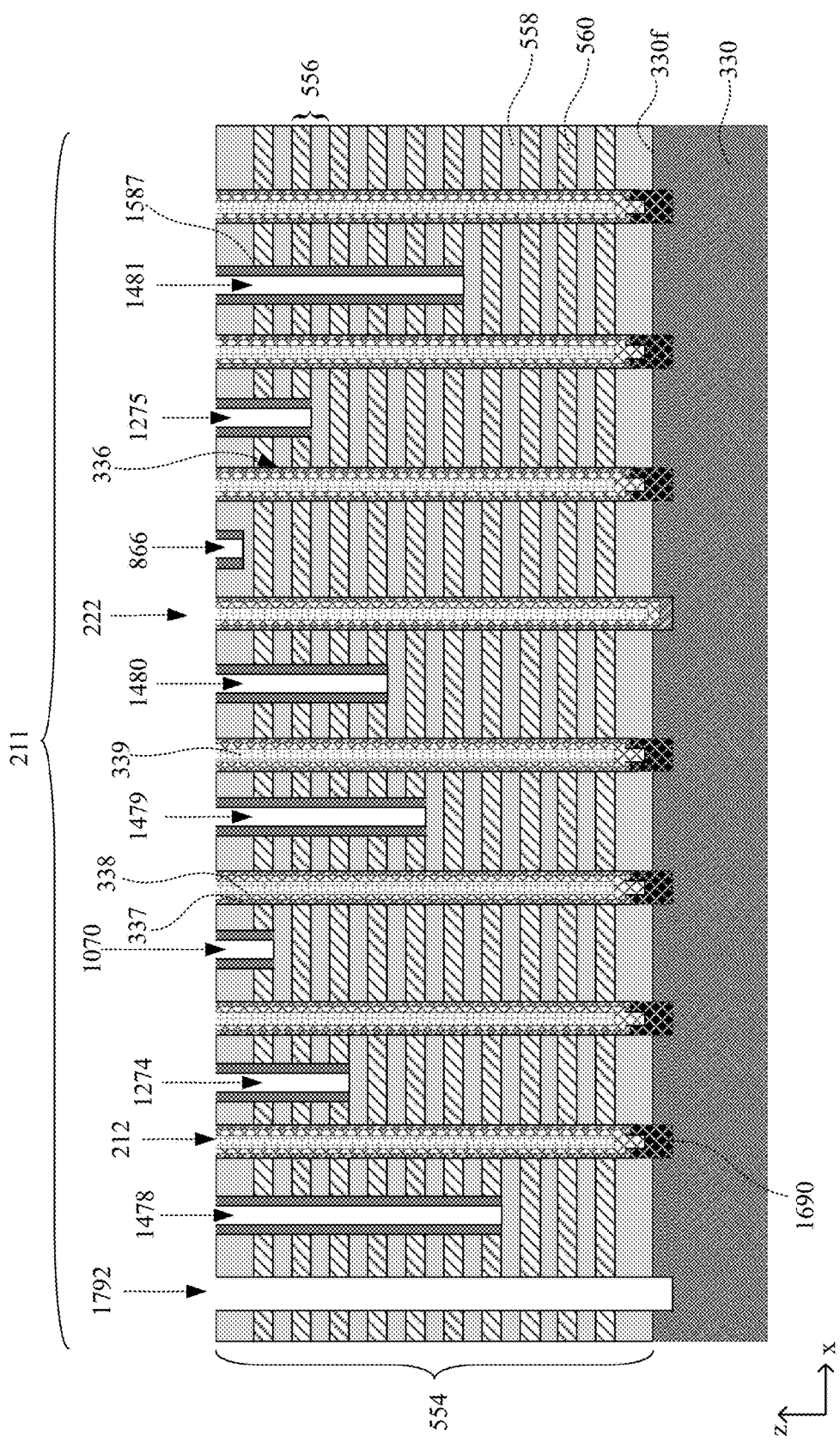

Referring to FIG. 22, at process step S2250, slit openings can be formed in the alternating dielectric stack. An exemplary 3D memory structure 2600 at process step S2250 is shown in FIG. 26, where the slit opening 1792 is similar to the one in FIG. 17 and can be formed using similar techniques.

Figure 27:
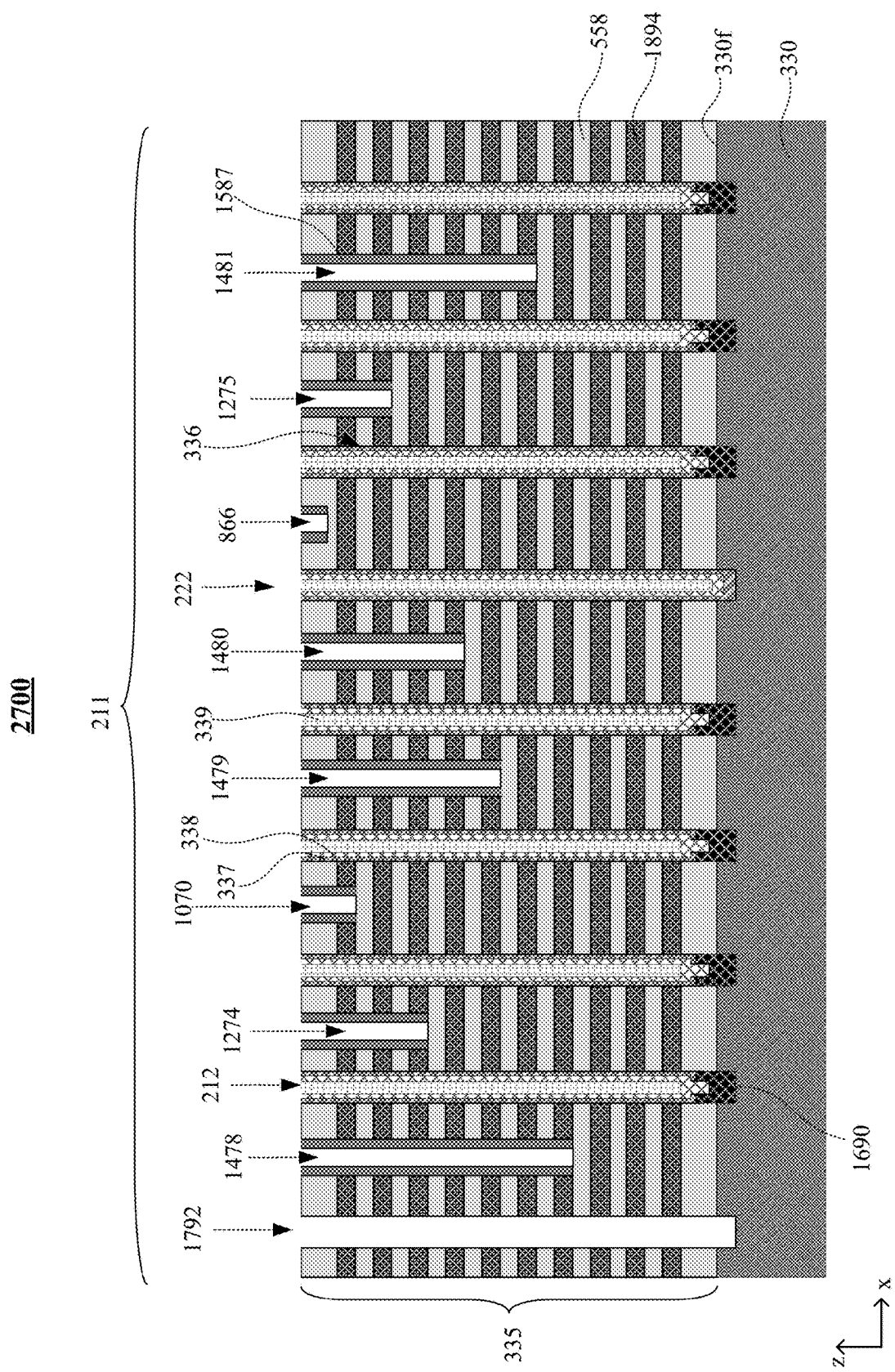

Referring to FIG. 22, at process step S2260, a film stack of alternating conductive and dielectric layers can be formed. An exemplary 3D memory structure 2700 at process step S2260 is shown in FIG. 27, where the film stack 335 of alternating conductive and dielectric layers is similar to the one in FIG. 18 and can be formed using similar techniques.

Figure 28:
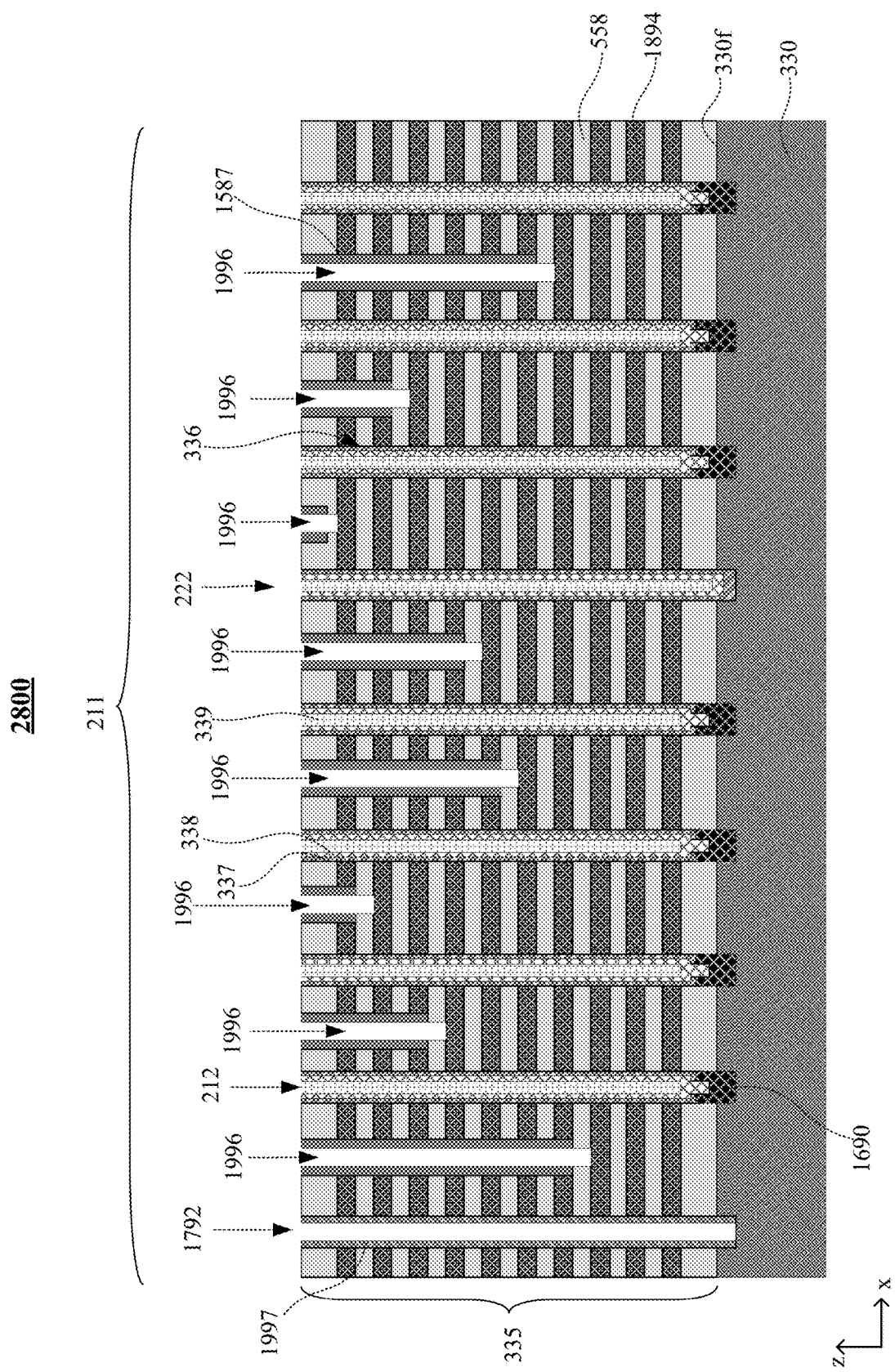

FIG. 28 illustrates a 3D memory structure 2800, according to some embodiments of the present disclosure. The 3D memory structure 2800 includes the isolation liner 1997 formed on a sidewall of the slit opening 1792. The isolation liner 1997 can be similar to the one in FIG. 19, and can be formed using similar techniques. The 3D memory structure 2800 can also include the contact holes 1996 formed inside the plurality of contact openings in FIG. 27 (e.g., the hard mask openings 866, the first subset of contact openings 1070, the second and third subsets of contact openings 1274-1275, and the fourth to seventh subset of contact openings 1478-1481). The contact holes 1996 expose top surfaces of the conductive layers 1894 and can be formed using similar techniques as the ones shown in FIG. 19.

Figure 29:
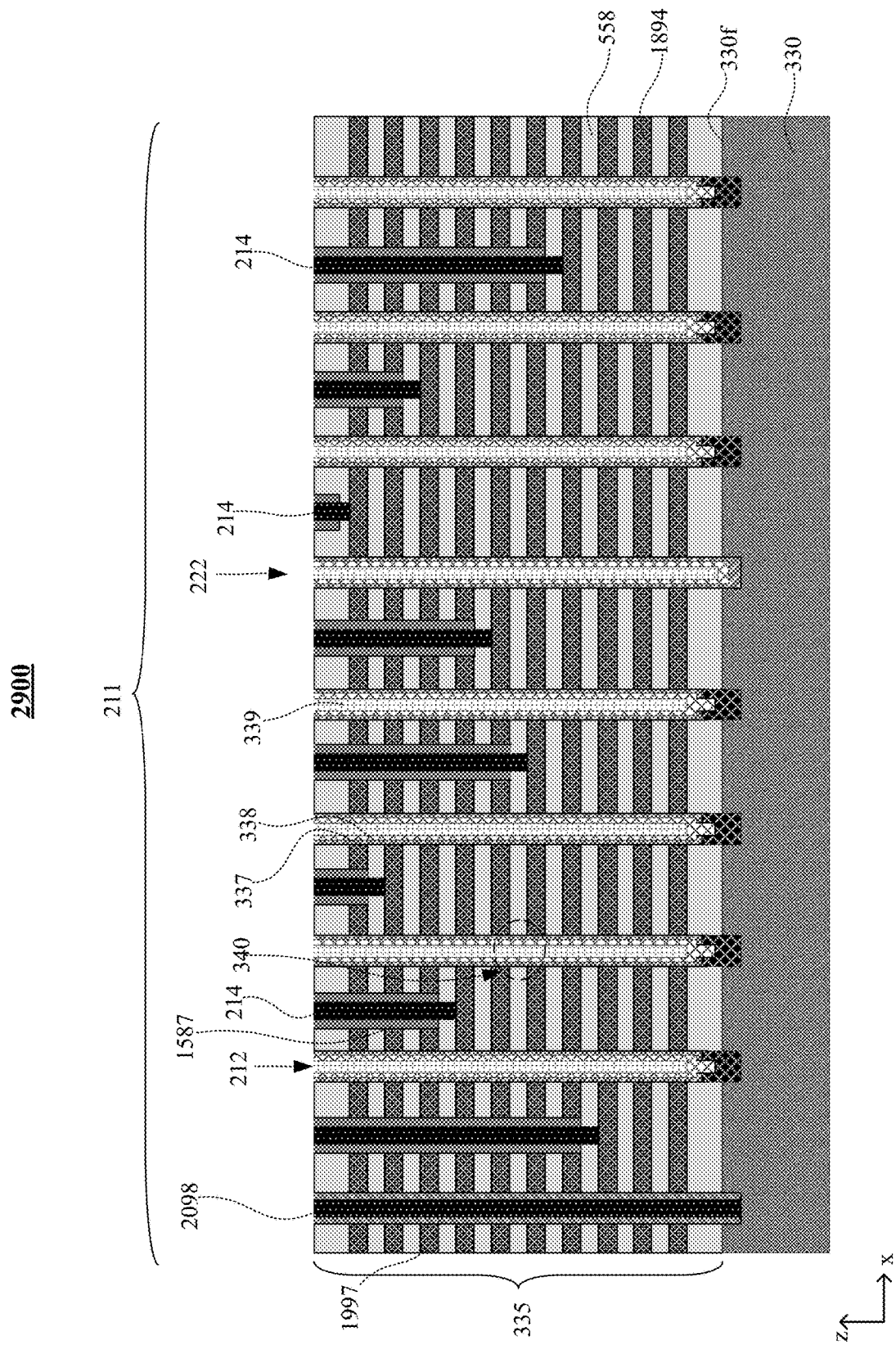

Referring to FIG. 22, at process step S2270, contact structures can be formed to electrically connect with the conductive layer in the film stack of alternating conductive and dielectric layers. An exemplary 3D memory structure 2900 at process step S2270 is shown in FIG. 29, where the contact structures 214 are similar to the ones in FIG. 20 and can be formed using similar techniques. The 3D memory structure 2900 can also include the common source contact 2098, similar to the one in FIG. 20.

Similar to fabricate process 400, fabrication process 2200 can also form at least one contact structure 214 for each conductive layer 1894 in the film stack 335 of alternating conductive and dielectric layers. These contact structures 214 can be formed inside the channel structure region 211 (in FIGS. 2-3), and can be arranged adjacent to the memory strings 212.

In summary, the present disclosure describes various embodiments of a 3D memory device and methods of making the same.

The first aspect of the present disclosure provides a method for forming a three-dimensional (3D) memory structure that includes disposing an alternating dielectric stack on a substrate, wherein the alternating dielectric stack includes first and second dielectric layers alternatingly stacked on top of each other. The method also includes forming a plurality of contact openings in the alternating dielectric stack such that a dielectric layer pair is exposed inside at least one of the plurality of contact openings, wherein the dielectric layer pair includes one pair of the first and second dielectric layers. The method further includes forming a film stack of alternating conductive and dielectric layers by replacing the second dielectric layer with a conductive layer, and forming a contact structure to contact the conductive layer in the film stack of alternating conductive and dielectric layers.

The formation of the plurality of contact openings includes forming a plurality of openings in the alternating dielectric stack by etching N number of dielectric layer pairs (N is a whole number). Next, a mask is formed to protect a first group of the plurality of openings and expose a second group of the plurality of openings, wherein the first group of the plurality of openings is a first subset of openings extending through the N number of dielectric layer pairs. The formation of the plurality of contact openings further includes forming a second subset of openings in the second group of the plurality of openings by etching M number of dielectric layer pairs (M is a whole number). The second subset of openings extend through (N+M) number of dielectric layer pairs. By repeating the steps of forming a mask and etching for each of the subsets of openings, the plurality of contact openings can be formed in the alternating dielectric stack.

The second aspect of the present disclosure provides a three-dimensional (3D) memory structure that includes a film stack disposed on a substrate, the film stack having conductive and dielectric layers alternatingly stacked on top of each other. The 3D memory structure also includes a plurality of memory strings vertically penetrating through the film stack, wherein each of the plurality of memory strings comprises a memory film, a channel layer and a core filling film. The 3D memory structure also includes a plurality of contact structures disposed inside the film stack, the plurality of contact structures vertically penetrating one or more conductive and dielectric layers such that each conductive layer of the film stack is electrically connected to at least one of the plurality of contact structures. The plurality of contact structures are surrounded by the plurality of memory strings.

The third aspect of the present disclosure provides another method for forming a three-dimensional (3D) memory structure that includes disposing an alternating dielectric stack on a substrate, wherein the alternating dielectric stack includes $2^n$ number of dielectric layer pairs, wherein n is an integer and each dielectric layer pair includes a first dielectric layer and a second dielectric layer that is different from the first dielectric layer. The method also includes forming a plurality of contact openings by using (n+1) cycles of repetitive patterning process. An i-th patterning process includes etching $2^{(i-1)}$ number of dielectric layer pairs such that top $2^i$ number of dielectric layer pairs are exposed inside the plurality of contact openings, where i is an integer ranging from 1 to n. The method of forming the 3D memory structure further includes forming a film stack of alternating conductive and dielectric layers by replacing the second dielectric layer with a conductive layer, and forming a contact structure electrically connected to the conductive layer in the film stack of alternating conductive and dielectric layers.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory structure, comprising:
    a film stack comprising conductive and dielectric layers alternatingly stacked on top of each other in a first direction;
    a common source contact penetrating the film stack in the first direction;
    memory strings in a channel structure region penetrating through the film stack in the first direction, wherein each of the memory strings comprises a memory film and a channel layer;
    contact structures in the channel structure region penetrating through one or more of the conductive and dielectric layers in the first direction such that a respective conductive layer of the film stack is electrically connected to at least one of the contact structures; and
    dummy memory strings adjacent to the contact structures and penetrating through the film stack in the first direction, each of the dummy memory strings comprising a core filling film, wherein:
        each of the contact structures comprises a liner surrounding a conductive material;
        the conductive material contacts the respective conductive layer of the film stack;
        the liner comprises an insulator configured to electrically isolate the contact structures from one or more conductive layers of the film stack in a second direction perpendicular to the first direction and is distant from the respective conductive layer of the film stack in the first direction;
        at least one memory string is directly adjacent to two contact structures that are on opposite sides of the at least one memory string in the second direction; and
        the common source contact comprises an isolation liner configured to electrically isolate the common source contact from the conductive layers of the film stack.

2. The 3D memory structure of claim 1, wherein the contact structures are coplanar with the film stack.

3. The 3D memory structure of claim 1, wherein the contact structures are randomly distributed in the channel structure region.

4. The 3D memory structure of claim 1, wherein each of the contact structures is directly adjacent to at least two memory strings.

5. The 3D memory structure of claim 1, further comprising:
    two directly adjacent contact structures electrically connected to a first conductive layer and a second conductive layer of the film stack, respectively, wherein one or more conductive layers of the film stack are located between the first conductive layer and the second conductive layer.

* * * * *